(12) United States Patent
Kobayashi et al.

(10) Patent No.: US 8,941,139 B2
(45) Date of Patent: Jan. 27, 2015

(54) LIGHT-EMITTING ELEMENT MOUNTING PACKAGE, LIGHT-EMITTING ELEMENT PACKAGE, AND METHOD OF MANUFACTURING THE SAME

(71) Applicant: Shinko Electric Industries Co., Ltd., Nagano (JP)

(72) Inventors: Kazutaka Kobayashi, Nagano (JP); Tadashi Arai, Nagano (JP); Yasuyuki Kimura, Nagano (JP)

(73) Assignee: Shinko Electric Industries Co., Ltd, Nagano (JP)

( * ) Notice: Subject to any disclaimer, the term of this patent is extended or adjusted under 35 U.S.C. 154(b) by 124 days.

(21) Appl. No.: 13/693,308

(22) Filed: Dec. 4, 2012

(65) Prior Publication Data

US 2013/0153945 A1   Jun. 20, 2013

(30) Foreign Application Priority Data

Dec. 19, 2011 (JP) ................................. 2011-277736

(51) Int. Cl.
*H01L 33/00* (2010.01)
*H05K 3/24* (2006.01)
(Continued)

(52) U.S. Cl.
CPC ............... *H01L 33/60* (2013.01); *H05K 1/056* (2013.01); *H05K 3/242* (2013.01); *H05K 3/284* (2013.01); *H05K 3/108* (2013.01); *H05K 2201/2054* (2013.01); *H01L 2224/73265* (2013.01); *H01L 33/62* (2013.01); *H05K 2201/10106* (2013.01); *H01L 2224/16225* (2013.01);
(Continued)

(58) Field of Classification Search
USPC ............................... 438/27, 106–127; 257/98
See application file for complete search history.

(56) References Cited

U.S. PATENT DOCUMENTS 6,200,451 B1 * 3/2001 Redline et al. .................. 205/85
7,053,421 B2 * 5/2006 Chang ........................... 257/102
(Continued)

FOREIGN PATENT DOCUMENTS

| EP | 1613135 | 1/2006 |
|----|---------|--------|
| JP | 2003-092011 | 3/2003 |
| JP | 2006-319074 | 11/2006 |

OTHER PUBLICATIONS

Extended European Search Report dated Jul. 22, 2013 with respect to the corresponding European Patent Application No. 12196409.2.

*Primary Examiner* — Mohammad Islam
*Assistant Examiner* — Ankush Singal
(74) *Attorney, Agent, or Firm* — Ipusa, PLLC

(57) ABSTRACT

A method of manufacturing a light-emitting element mounting package including laminating a metallic layer on an insulating layer; forming a light-emitting element mounting area which includes a pair of electroplating films formed by electroplating using the metallic layer as a power supply layer on the metallic layer; forming a light-emitting element mounting portion in which a plurality of wiring portions are separated by predetermined gaps, by removing predetermined portions of the metallic layer, wherein, in the forming the light-emitting element mounting portion, the metallic layer is removed so that one of the pair of electroplating films belongs to one wiring portion of the plurality of wiring portions and another of the pair of electroplating films belongs to another wiring portion adjacent to the one wiring portion.

14 Claims, 29 Drawing Sheets

(51) Int. Cl.
   *H05K 3/10*    (2006.01)
   *H01L 33/60*    (2010.01)
   *H05K 1/02*    (2006.01)
   *H05K 1/05*    (2006.01)
   *H05K 3/28*    (2006.01)
   *H01L 33/62*    (2010.01)
   *H01L 25/075*    (2006.01)

(52) U.S. Cl.
   CPC .......... *H05K 1/0274* (2013.01); *H01L 25/0753* (2013.01); *H01L 2224/48091* (2013.01); *H05K 3/243* (2013.01)

USPC .................... 257/98; 257/88; 257/89; 257/90; 257/91; 257/92; 438/106; 438/127; 438/27

(56)         References Cited

U.S. PATENT DOCUMENTS

| 2003/0072153 | A1  | 4/2003  | Matsui et al. |
| 2011/0101384 | A1* | 5/2011  | Betsuda et al. .................. 257/88 |
| 2011/0121326 | A1  | 5/2011  | Tan et al. |
| 2011/0278630 | A1  | 11/2011 | Urasaki et al. |

* cited by examiner imitting element mounting package, a light-emitting element package in which plural light-emitting elements are mounted on the light-emitting element mounting package, and a method manufacturing of these.

LIGHT-EMITTING ELEMENT MOUNTING PACKAGE, LIGHT-EMITTING ELEMENT PACKAGE, AND METHOD OF MANUFACTURING THE SAME

CROSS-REFERENCE TO RELATED APPLICATION(S)

This patent application is based upon and claims the benefit of priority of the prior Japanese Patent Application No. 2011-277736 filed on Dec. 19, 2011, the entire contents of which are incorporated herein by reference.

FIELD

The present invention relates to a light-emitting element mounting package, a light-emitting element package in which plural light-emitting elements are mounted on the light-emitting element mounting package, and a method manufacturing of these.

BACKGROUND

In recent years, light-emitting diodes (hereinafter, LED) attract the attention because the LEDs consume lower power and have longer operating lives in various light sources. For example, there is proposed a LED light module, on which plural LEDs are mounted. In such a LED module, a reflective film (an insulating layer) for reflecting an emitted light emitted from a LED is formed on an uppermost layer. A light-emitting element mounting area (a land), on which the LED is mounted, is formed so that the light-emitting element mounting area is exposed on the reflective film. Further, a plating film is formed to improve connection reliability between the light-emitting element mounting area and the LED mounted on the light-emitting element mounting area. These are disclosed in Japanese Laid-open Patent Publication No. 2003-092011 and Japanese Laid-open Patent Publication No. 2006-319074.

SUMMARY

According to an aspect of the embodiment, there is provided a method of manufacturing a light-emitting element mounting package including laminating a metallic layer on an insulating layer; forming a light-emitting element mounting area on the metallic layer, the light-emitting element mounting area including a pair of electroplating films, the pair of electroplating films being formed by electroplating using the metallic layer as a power supply layer; forming a light-emitting element mounting portion, in which a plurality of wiring portions are separated by predetermined gaps, by removing predetermined portions of the metallic layer, wherein, in the forming the light-emitting element mounting portion, the metallic layer is removed so that one of the pair of electroplating films belongs to one wiring portion of the plurality of wiring portions and another of the pair of electroplating films belongs to another wiring portion adjacent to the one wiring portion.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

DESCRIPTION OF EMBODIMENTS

As described previously, the plating film may be formed by electroless plating applied to the light-emitting element mounting area which is exposed on the reflective film. For this, the reflective film is dipped into a plating solution in an electroless plating bath in order to undergo the electroless plating. In this instance, there is a problem that the plating solution soaks through the reflective film to thereby degrade the reflective film. Specifically, there is a problem that the reflectance ratio of the reflective film is degraded.

Preferred embodiments of the present invention will be described with reference to accompanying drawings. Where the same reference symbols are attached to the same parts, repeated description of the parts is omitted.

[a] First Embodiment

[Structure of Light-Emitting Element Mounting Package of the First Embodiment]

Figure 1:
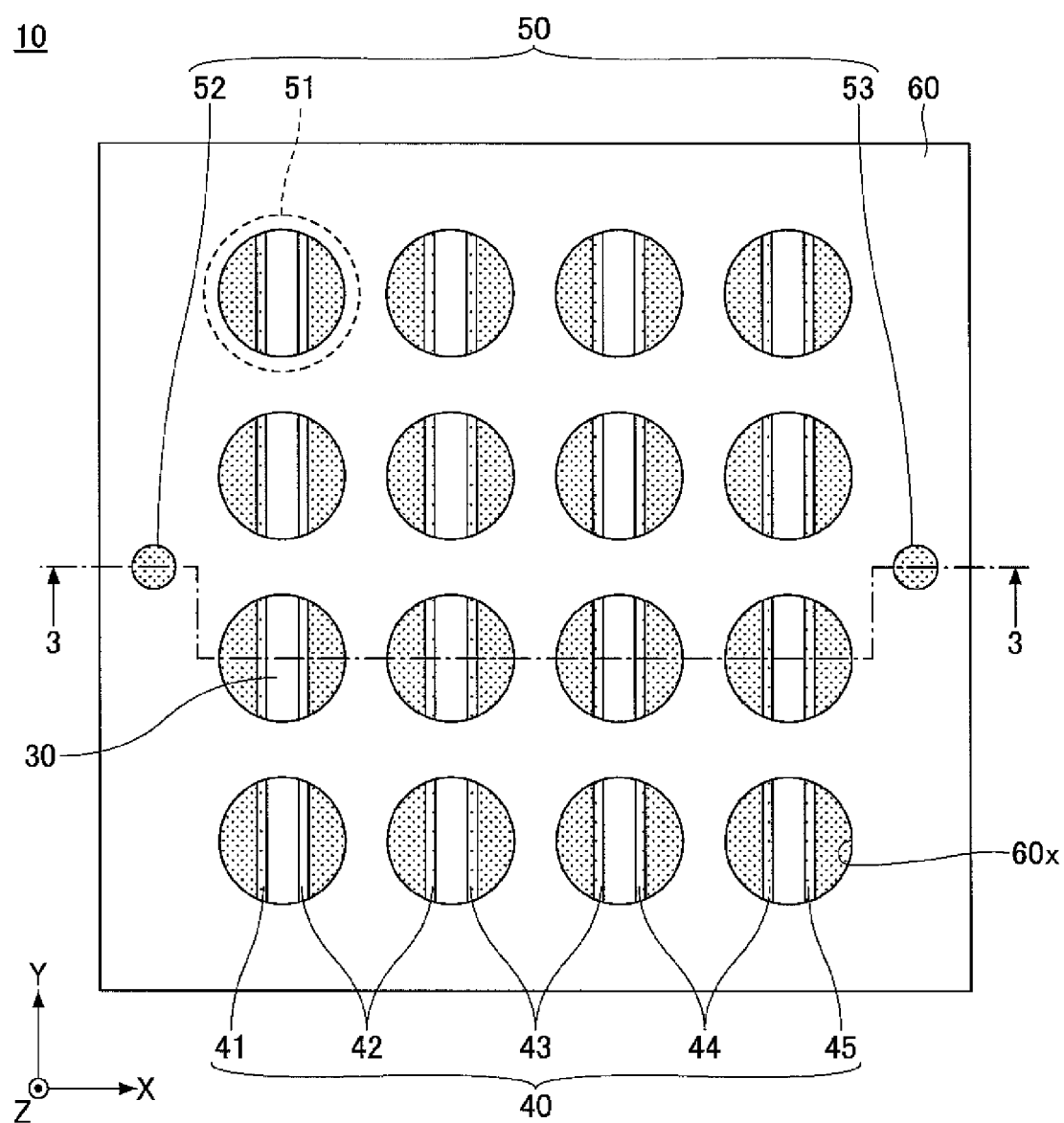
FIG. 1 is a plan view of a light-emitting element mounting package of first embodiment.
Figure 2:
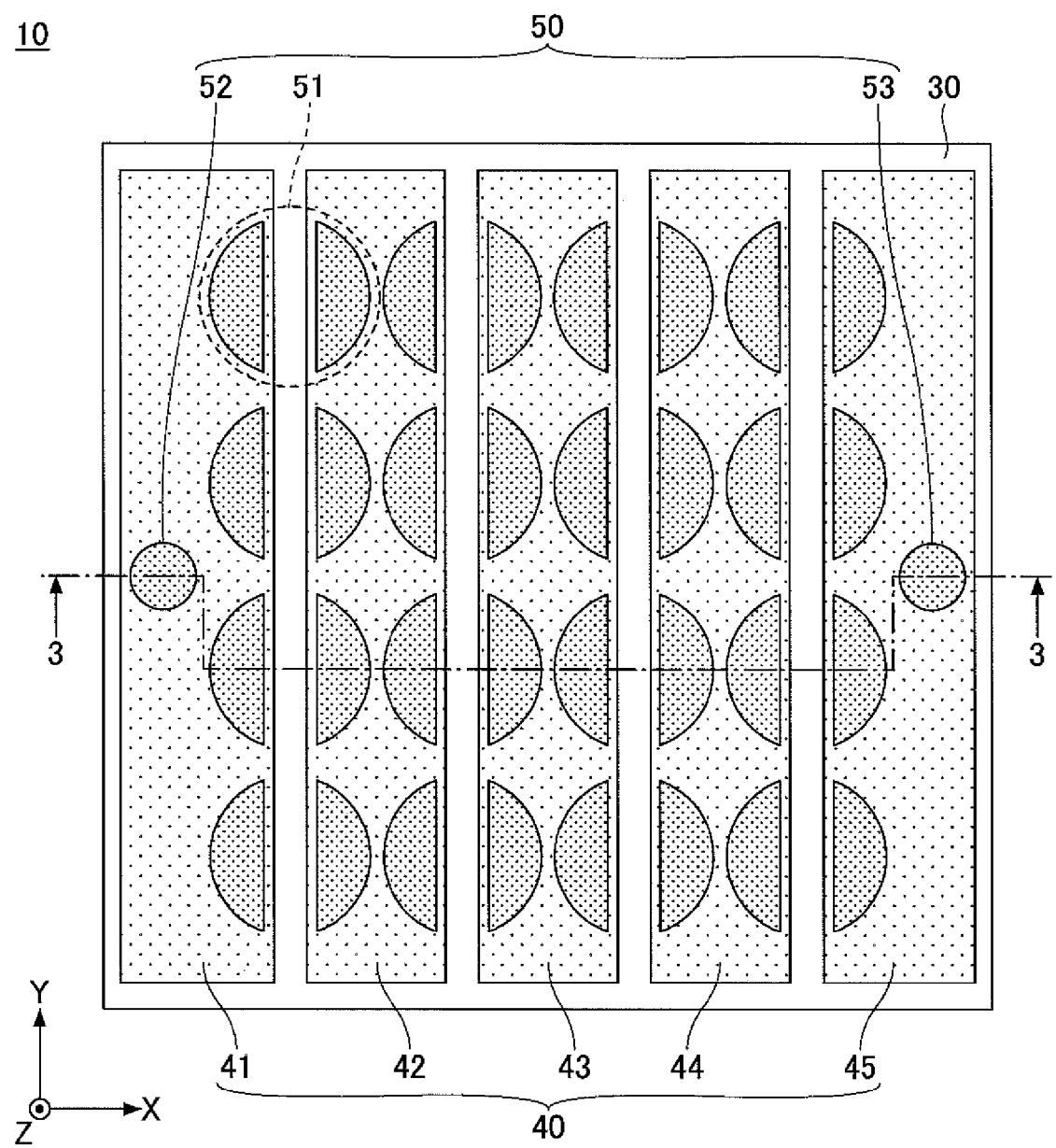
FIG. 2 is another plan view of the light-emitting element mounting package of the first embodiment.
Figure 3:
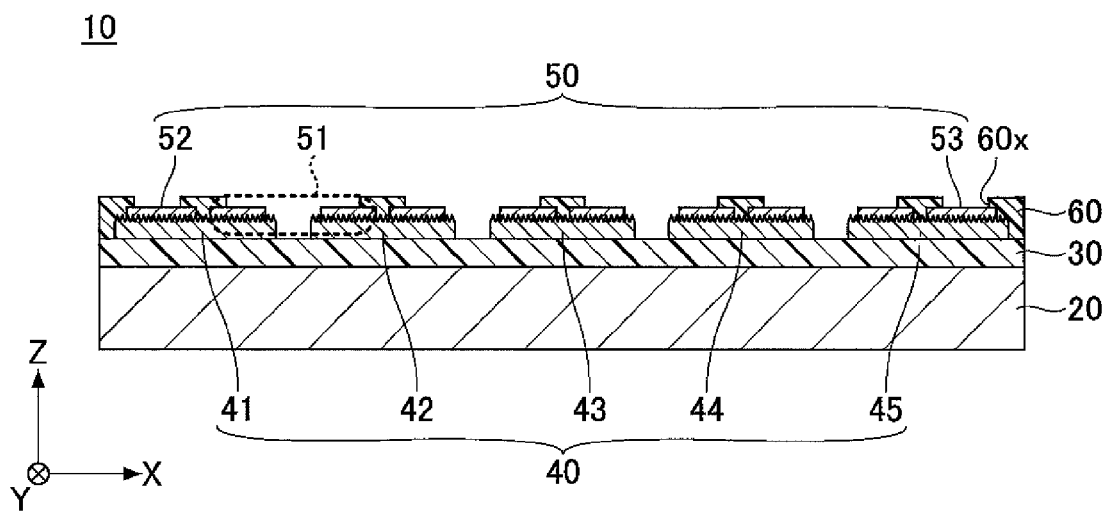
FIG. 3 is a cross-sectional view taken along a line 3-3 of FIG. 1.

The structure of a light-emitting element mounting package of the first embodiment is described. FIG. 1 is a plan view of a light-emitting element mounting package of the first embodiment. FIG. 2 is another plan view of the light-emitting element mounting package of the first embodiment. In FIG. 2, a reflective film illustrated in FIG. 1 is omitted. FIG. 3 is a cross-sectional view taken along a line 3-3 of FIGS. 1-2. For convenience, light-emitting element mounting portions 40 and electroplating films 50 are patterned by dots in FIGS. 1 and 2 (similar in FIGS. 10A, 10B, 13A, 13B, 31A, 313, 33A, 33B, 34A, 34B, 35A, 35B, 37A, 37B, 38, and 39).

Referring to FIGS. 1 to 3, the light-emitting element mounting package 10 includes a metallic plate 20, an insulating layer 30, light-emitting element mounting portions 40, electroplating films 50, and a reflective film 60. A protection film made of a resin such as epoxy or acrylic may be used instead of the reflective film 60.

The metallic plate 20 functions as a radiator plate for outward emitting heat generated by a light emitting element mounted on the light-emitting element mounting package 10 outside the light-emitting element mounting package 10. The metallic plate 20 is a base for forming an insulating layer 30 and a light-emitting element mounting portion 40. For example, the material of the metallic plate 20 may be copper (Cu), a copper alloy, aluminum, an aluminum alloy, or the like having good heat conductivity. The thickness of the metallic plate 20 may be about 100 μm to 2000 μm.

The insulating layer 30 is formed on the metallic plate 20. The insulating layer 30 insulates the metallic plate 20 from the light-emitting element mounting portion 40. The material of the insulating layer 30 may be, for example, a polyimide insulating resin. However, an epoxy resin to which an alumina filler of 50 wt % is added may be used instead of the polyimide insulating resin. The thickness of the insulating layer 30 is, for example, about 15 μm to 200 μm.

The light-emitting element mounting portion 40 includes wiring portions 41 to 45, which are electrically insulated from one another. The light-emitting element mounting portion 40 is formed on the insulating layer 30. The material of the light-emitting element mounting portion 40 is a metal such as copper (Cu). The thickness of the light-emitting element mounting portion 40 is, for example, about 20 μm to 100 μm.

The wiring portions 41 to 45 are shaped like rulers or rectangles in their plan views. The wiring portions 41 to 45 are arranged so that a predetermined gap is interposed between facing long sides of adjacent wiring portions. For example, the long sides of the wiring portions 41 to 45 are about 5 mm to 10 mm, the short sides of the wiring portions 41 to 45 are about 1 mm to 5 mm, and the gaps among the wiring portions 41 to 45 are about 50 μm to 500 μm.

The electroplating films 50 are formed on predetermined areas of the wiring portions 41 to 45. The object of forming the electroplating films 50 is to improve connection reliability between parts and the electroplating films 50. The wiring portions 41 to 45 are roughened on their surfaces, on which the electroplating films 50 are formed. The object of roughening the surfaces of the wiring portions 41 to 45 is to improve contact between the wiring portions 41 to 45 and the reflective film 60 by an "anchor effect".

For example, the electroplating films 50 are made of Ni or a Ni alloy/Au or a Au alloy, Ni or a Ni alloy/Pd or a Pd alloy/Au or a Au alloy, Ni or a Ni alloy/Pd or a Pd alloy/Ag or a Ag alloy/Au or a Au alloy, Ag or a Ag alloy, Ni or a Ni alloy/Ag or a Ag alloy, Ni or a Ni alloy/Pd or a Pd alloy/Ag or a Ag alloy, or the like. In this, the expression of "AA/BB" means a film of AA and a film of BB are laminated in this order on the location where the electroplating film 50 is formed (similar when three or more films are formed).

It is preferable that the thicknesses of the Au film or the Au alloy film and the Ag film or the Ag alloy film are 0.1 μm or greater. It is preferable that the thickness of the Pd film or the Pd alloy film is 0.005 μm or greater. It is preferable that the thickness of the Ni film or the Ni alloy film is 0.5 μm or greater.

Because the reflectance ratios of an Ag film and an Ag alloy film are high, if the uppermost layers of the electroplating films 50 are formed to be the Ag film or the Ag alloy film, the reflectance ratio of light emitted by a light-emitting element can be preferably increased.

A light-emitting element mounting area 51 is formed by mutually facing electroplating films 50 which are respectively formed on adjacent wiring portions. The light-emitting element mounting area 51 is formed by electroplating films 50, which are shaped like semicircles in their plan views and arranged while interposing the gap between the wiring portions respectively having the electroplating films 50. One light-emitting element having two terminals may be installed in the light-emitting element mounting area 51. However, one light-emitting element having four terminals may be installed in the light-emitting element mounting area 51.

Specifically, the number of the light-emitting element mounting areas 51 is plural. The light-emitting element mounting areas 51 are formed on surfaces of the adjacent wiring portions 41 to 45 by pairs of the corresponding electroplating films 50, which are arranged while interposing the gaps between the adjacent wiring portions 41 to 45 respectively having the pair of corresponding electroplating films 50. One of the pair of the electroplating films 50 forming each of the light-emitting element mounting areas 51 corresponds to one of the adjacent wiring portions. The other of the pair of the electroplating films 50 forming each of the light-emitting element mounting areas 51 corresponds to the other of the adjacent wiring portions. Plural light-emitting elements can be arranged in parallel on the adjacent wiring portions 41 to 45. For example, plural light-emitting elements (four light-emitting elements in the first embodiment) may be arranged in parallel along the longitudinal directions of the adjacent wiring portions 41 and 42 on the adjacent wiring portions 41 and 42. In a manner similar to the above, plural light-emitting elements (four light-emitting elements in the first embodiment) may be arranged in parallel along the longitudinal directions of the adjacent wiring portions 42 and 43, the adjacent wiring portions 43 and 44, or the adjacent wiring portions 44 and 45 on the adjacent wiring portions 42 and 43, the adjacent wiring portions 43 and 44, or the adjacent wiring portions 44 and 45.

Further, the plural light-emitting elements can be arranged in series along the direction (the X direction in FIGS. 1 and 2) arranging the wiring portions. For example, the light-emitting elements (four light-emitting elements in the first embodiment) can be arranged in series over the gap between the adjacent wiring portions 41 and 42, the gap between the adjacent wiring portions 42 and 43, the gap between the adjacent wiring portions 43 and 44, and the gap between the adjacent wiring portions 44 and 45.

For example, the shapes of the electroplating films may be shaped like a ruler or a rectangle in their plan views. In this case, the light-emitting element mounting area 51 may be formed by the rectangular electroplating films on corresponding wiring portions so that the rectangular electroplating films mutually face. With the first embodiment, sixteen light-emitting element mounting areas 51 are formed to accept mounting of sixteen light-emitting elements. However, the number of the light-emitting element mounting areas 51 can be arbitrarily determined.

On the wiring portion 41, a first electrode 52 is formed by the electroplating film 50. The first electrode 52 is electrically connected to a part of the light-emitting element mounting areas 51 formed on the wiring portion 41. On the wiring portion 45, a second electrode 53 is formed by the electroplating film 50. The second electrode 53 is electrically connected to a part of the light-emitting element mounting areas 51 formed on the wiring portion 45. The first electrode 52 and the second electrode 53 are connected to, for example, a power source, a driving circuit, or the like which is arranged outside the light-emitting element mounting package 10.

The reflective film 60 is formed on or over the insulating layer 30 so as to cover the light-emitting element mounting portions 40 and the electroplating films 50. Referring to FIG. 1, the reflective film 60 includes opening portions 60x. Parts of the light-emitting element mounting areas 51 are exposed through the opening portion 60x. The light-emitting element mounting areas 51 may be entirely exposed through the opening portions 60x.

The material of the reflective film 60 may be, for example, an epoxy insulating resin, a silicone insulating resin, or the like. Preferably, the color of the reflective film 60 is white in order to increase the reflectance ratio for light emitted by the light-emitting elements. The reflective film 60 can be colored white by adding filler such as titanium oxide to the reflective film 60 so that the reflective film 60 contains the filler. Instead of titanium oxide, pigment such as $BaSO_4$ may be used to color the reflective film white. The thickness of the reflective film 60 may be, for example, about 10 μm through about 50 μm.

With the first embodiment, the reflective film 60 is not formed on parts of the insulating layer 30 exposed through the gaps between the adjacent wiring portions. However, the reflective film 60 may be formed to cover the exposed parts of the insulating layer 30, and parts of the light-emitting element mounting portions 40 and the electroplating films 50 in the vicinity of the exposed parts of the insulating layer 30.

Figure 4:
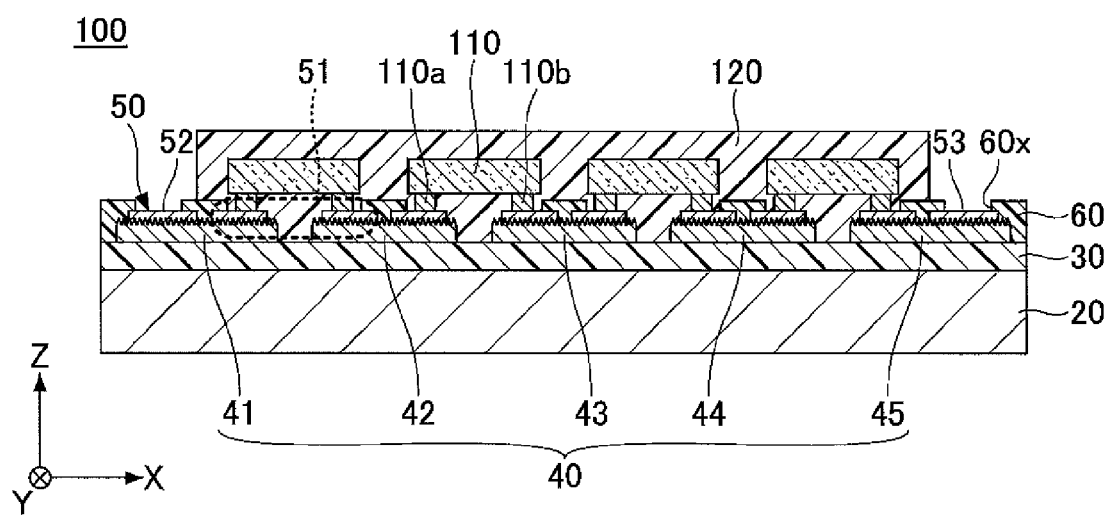
FIG. 4 is a cross-sectional view of a light-emitting element package of the first embodiment.

FIG. 4 is a cross-sectional view of a light-emitting element package of the first embodiment. Referring to FIG. 4, the light-emitting element package 100 is formed by mounting plural light-emitting elements 110 on the light-emitting element mounting areas 51 through the length and breadth of the light-emitting element mounting package. Then, the mounted light-emitting elements 110 are sealed by a sealing resin 120. The sealing resin 120 is formed to expose a part or all of each of the first electrode 52 and the second electrode 53.

The light-emitting elements 110 may be an LED having an anodic terminal on one side and a cathodic terminal on an opposite side. However, the light-emitting element 110 is not limited to the LED. For example, a surface emitting laser or the like may be used. The sealing resin 120 may be formed by adding a fluorescent material to a silicone insulating resin.

Hereinafter, a case where the light-emitting element 110 is an LED and the light-emitting element package 100 is an LED module is exemplified. The light-emitting element 110 may be called the LED 110 and the light-emitting element package 100 may be called the LED module 100.

The dimensions of the LED 110 mounted on the light-emitting element mounting areas 51 in its plan view is, for example, 0.3 mm in length (in the Y direction)×the 0.3 mm in width (in the X direction), 1.0 mm in length (in the Y direction)×1.0 mm in width (in the X direction), 1.5 mm in length (the Y direction)×the 1.5 mm in width (in the X direction), or the like.

Each LED 110 has a bump 110a as one electric terminal and a bump 110b as the other electric terminal. One of the bumps 110a and 110b is the anodic terminal, and the other of the bumps 110a and 110b is the cathodic terminal. For example, the bumps 110a and 110b are connected to corresponding parts of the corresponding wiring portions by flip-chip bonding, respectively. The LEDs 110 are arranged in the same direction. In this case, the LEDs 110 are mounted so that the anodic terminals of the LEDs 110 are arranged to face the left side of FIG. 1.

It is preferable to provide plural bumps 110a and plural bumps 110b for each LED 110. If the number of the bumps 110a and the number of the bumps 110b are one each, each terminal of the LED 110 is connected to the corresponding part of the light-emitting element mounting area 51 only at one position. Therefore, the LED 110 may be obliquely mounted. When the number of the bumps 110a and the number of the bumps 110b are plural, each terminal of the LED is supported by plural positions over the corresponding wiring portion 40. Therefore, the LEDs 110 are stably mounted on the light-emitting element mounting areas 51. Further, heat generated by the LEDs 110 can be radiated via the bumps 110a and 110b, of which numbers are large.

The gaps between the adjacent wiring portions are substantially the same as the gap between the bumps 110a and 110b of the corresponding LEDs 110. The gaps may be, for example, 60 μm. Thus, the LEDs 110 are mounted in series between the wiring portion 41 and the wiring portion 42, between the wiring portion 42 and the wiring portion 43, between the wiring portion 43 and the wiring portion 44, and between the wiring portion 44 and the wiring portion 45 (the X direction).

Further, the lengths of the wiring portions 41 to 45 in the Y direction is several times to several tens of times the lengths of the LEDs 110 in the Y direction. Therefore, plural LEDs 110 are mounted in parallel over the wiring portion 41 and the wiring portion 42 in the Y direction. Similarly, plural LEDs 110 are mounted in parallel over the wiring portion 42 and the wiring portion 43, the wiring portion 43 and the wiring portion 44, and the wiring portion 44 and the wiring portion 45 in the Y direction.

[Manufacturing Method of Light-Emitting Element Mounting Package of the First Embodiment, and Manufacturing Method of Light-Emitting Element Package]

Next, a manufacturing method of the light-emitting element mounting package 10 of the first embodiment, and a manufacturing method of a light-emitting element package 100 are described. FIGS. 5 to 15 illustrate manufacturing processes of a light emitting element mounting package 10 of the first embodiment. FIGS. 16 to 20 illustrate manufacturing processes of a light emitting element mounting package 10 of the first embodiment. The manufacturing processes are basically illustrated by cross-sectional views. However, when necessary, the manufacturing processes are illustrated by a plan view and a cross-sectional view.

Figure 5:
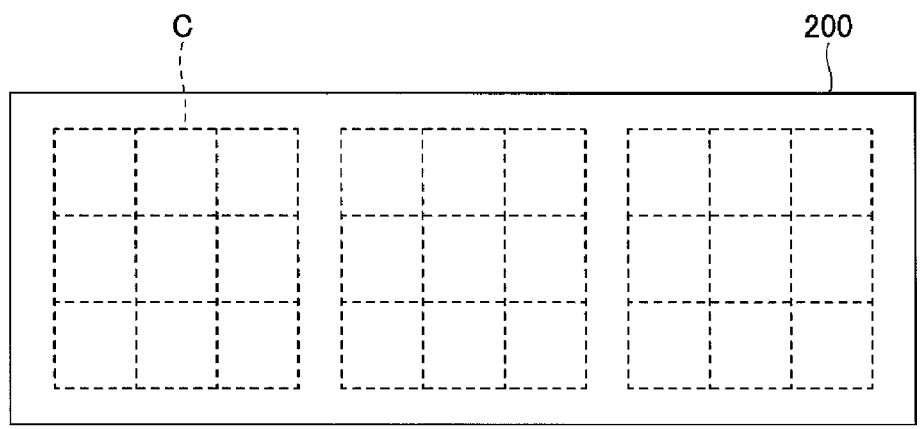
FIG. 5 illustrates a manufacturing process of the light-emitting element mounting package of the first embodiment.
Figure 6:
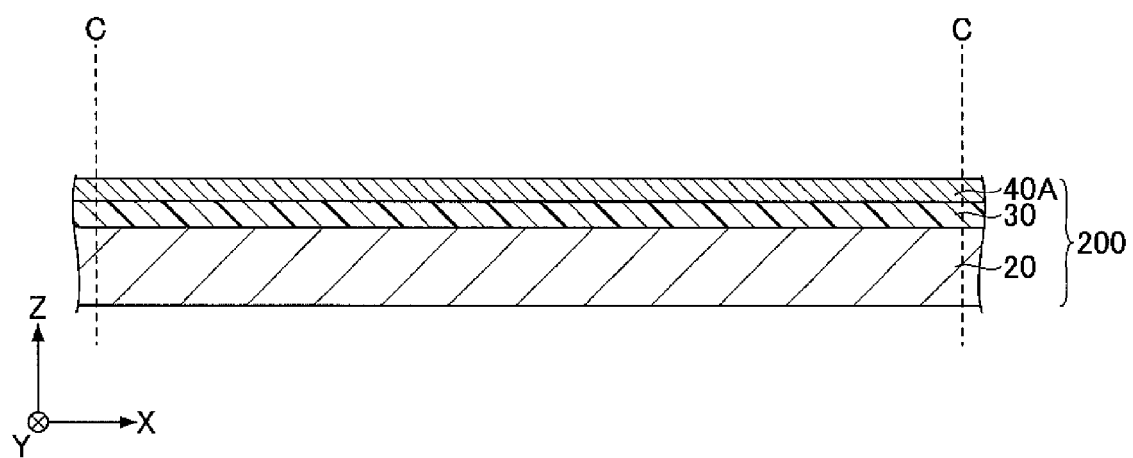
FIG. 6 illustrates the manufacturing process of the light-emitting element mounting package of the first embodiment.

In the processes illustrated in FIGS. 5 and 6, a base member 200 is prepared. As illustrated, FIG. 5 is a plan view where a cut lines are indicated by "C". Plural light-emitting element mounting packages 10 (27 pieces) are obtained by cutting the base member 200 processed by predetermined steps in FIGS. 7 to 15. Said differently, the areas surrounded by the cut lines C are going to be the light-emitting element mounting packages 10. Referring to FIG. 6, a cross-sectional view taken along the line 3-3 in FIG. 1 is illustrated. FIG. 6 illustrates one of the areas surrounded by the cut lines C.

The base member 200 may be, for example, a so-called "clad material" which is formed by sequentially laminating the insulating layer 30 and the metallic layer 40A, which finally becomes the light-emitting element mounting portion 40, on the metallic plate 20. However, the base member 200 may be formed by single step laminating of laminating the insulating layer 30 and the metallic layer 40A. The base member 200 in its plan view is shaped like a ruler or a rectangle. The dimensions of the base member are, for example, about 650 mm in length (in the Y direction)×about 500 mm in length (in the X direction).

For example, in the base member 200, the material of the metallic plate 20 may be, for example, copper (Cu), a copper alloy, aluminum, an aluminum alloy, or the like having good heat conductivity. The thickness of the metallic plate 20 may be, for example, about 100 μm to about 2000 μm. The material of the insulating layer 30 may be, for example, a polyimide insulating resin or the like. However, an epoxy resin to which an alumina filler of 50 wt % is added may be used instead of the polyimide insulating resin. The thickness of the insulating layer 30 is, for example, about 15 μm to about 200 μm. The material of the metallic layer 40A may be, for example, metallic foil such as copper foil. The thickness of the metallic layer 40A may be about 20 μm to about 100 μm. Hereinafter, one area of the base member 200 surrounded by the cut lines C is used in explaining the processes.

Figure 7:
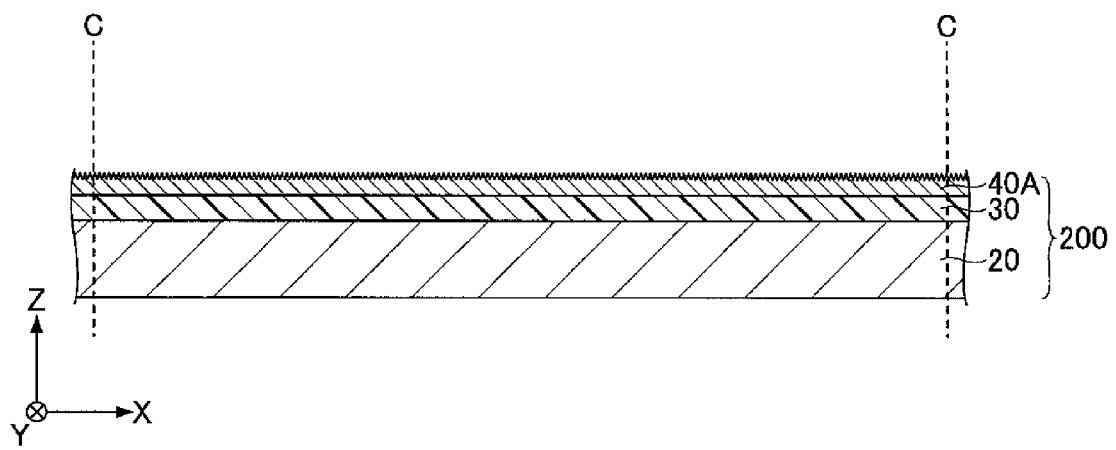
FIG. 7 illustrates the manufacturing process of the light-emitting element mounting package of the first embodiment.

Referring to FIG. 7, a first surface of the metallic layer 40A, which first surface is opposite to a surface contacting the insulating layer 30, is roughened. The first surface of the metallic layer 40A may be roughened by applying chemical polishing (micro-etching) on the first surface of the metallic layer 40A by, for example, the CZ process served by MEC corporation. Instead of the CZ process, the first surface of the metallic layer 40A may be roughened by another measure such as black oxidation (black oxide) or blasting as physical roughening.

Figure 8:
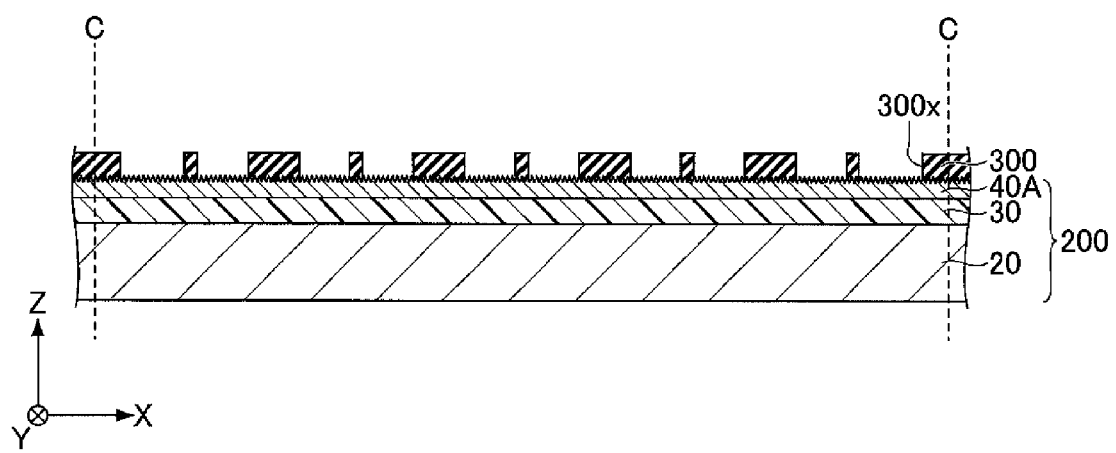
FIG. 8 illustrates the manufacturing process of the light-emitting element mounting package of the first embodiment.

Next, referring to FIG. 8, the resist layer 300 having opening portions 300x at positions corresponding to the electroplating films 50 is formed on the roughened first surface of the metallic layer 40A. On the areas surrounded by the cut lines C illustrated in FIG. 5, the resist layer 300 including the opening portions 300x is formed. The positions of the roughened first surface of the metallic layer 40A corresponding to the electroplating films 50 are exposed through the opening portions 300x.

For example, in order to form the resist layer 300, a resist in liquid or paste form made of a photosensitive resin material which contains an epoxy resin, an acrylic resin or the like is coated on the first surface of the metallic layer 40A. Instead, for example, a resist in film form (e.g., a dry film resist) made of a photosensitive resin material which contains an epoxy resin, an acrylic resin or the like is laminated on the first surface of the metallic layer 40A.

By irradiating the coated or laminated resist with light and developing the coated or laminated resist, the opening portions 300x are formed. Thus, the resist layer 300 having the opening portions 300x on the first surface of the metallic layer 40A is formed. It is possible to laminate a resist in film form previously provided with the opening portions 300x on the first surface of the metallic layer 40A.

Figure 9:
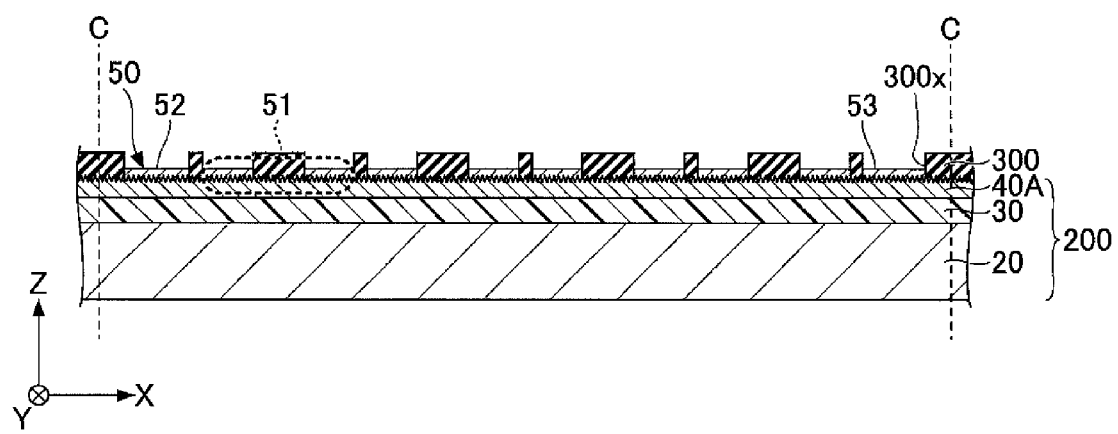
FIG. 9 illustrates the manufacturing process of the light-emitting element mounting package of the first embodiment.

Referring to FIG. 9, the electroplating films 50 including the light-emitting element mounting areas 51, the first electrode 52 and the second electrode 53 are formed inside the opening portions 300x on the first surface of the metallic layer 40A by electroplating using the metallic layer 40A as a power supply layer. In this process, the light-emitting element mounting areas 51 made of the pairs of electroplating films separated by the predetermined gaps are formed. In the electroplating films 50, the type, the thickness and so on are as described above. Because the reflectance ratios of an Ag film and an Ag alloy film are high, if the uppermost layers of the electroplating films 50 are formed to be the Ag film or the Ag alloy film, the reflectance ratio of light emitted by a light-emitting element can be preferably increased.

Figure 10A:
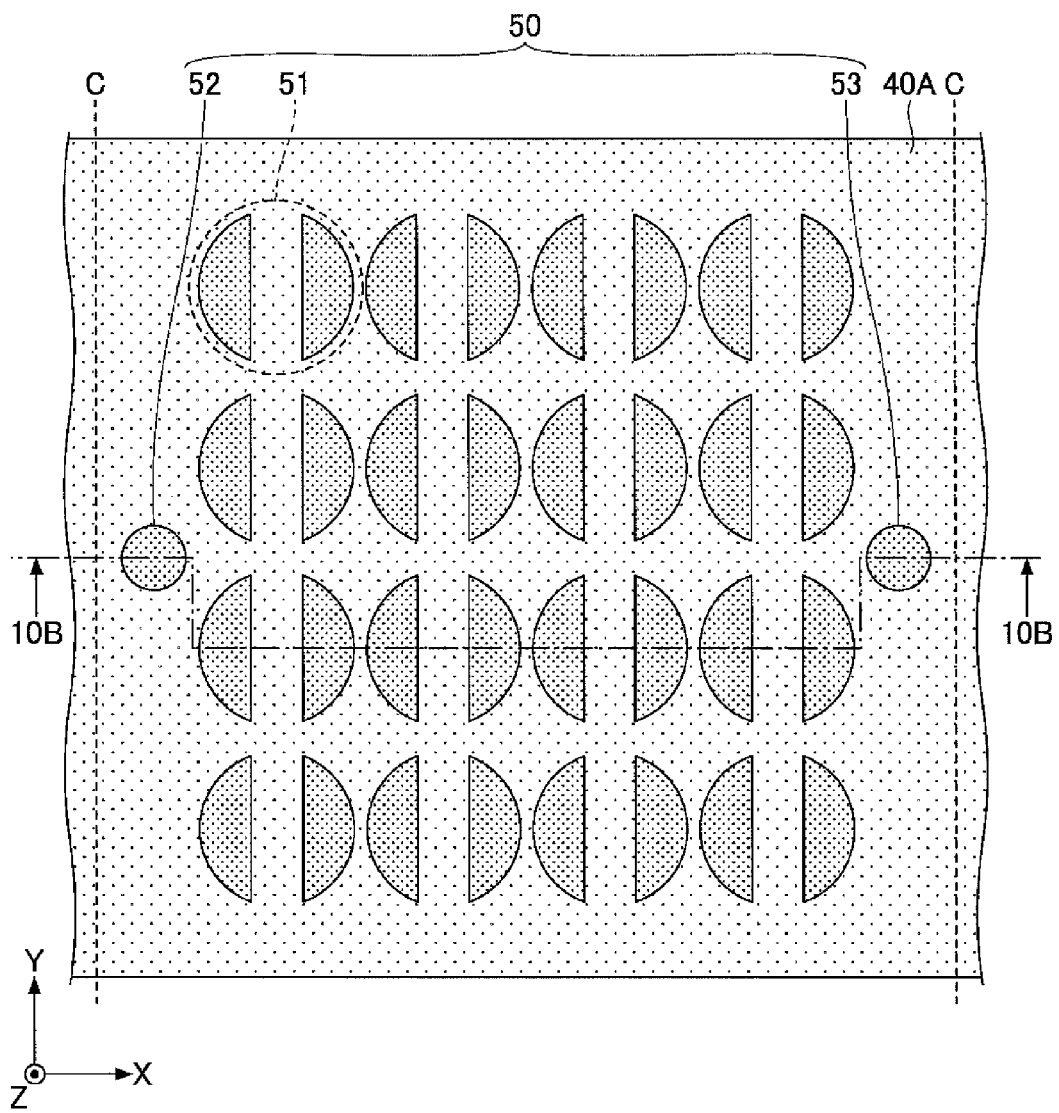
FIG. 10A illustrates the manufacturing process of the light-emitting element mounting package of the first embodiment.
Figure 10B:
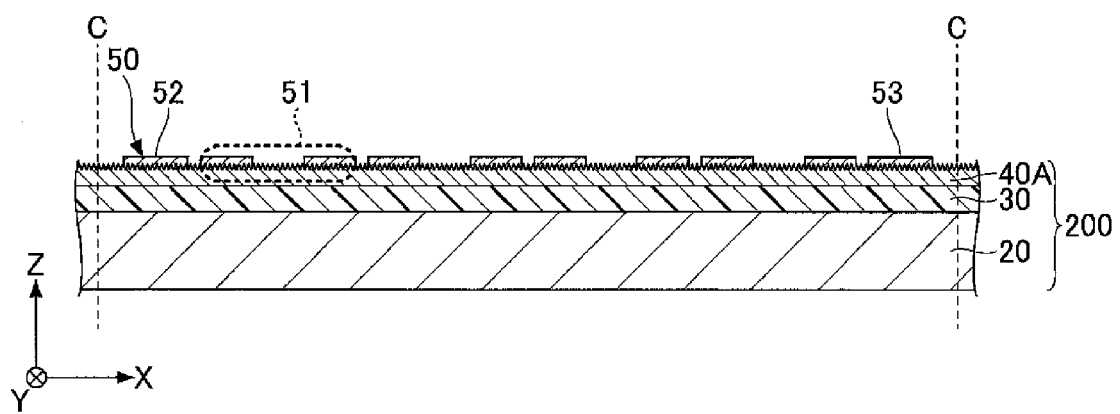
FIG. 10B illustrates a cross-sectional view of the light-emitting element mounting package illustrated in FIG. 10A taken along a line 10B-10B.

Referring to FIGS. 10A and 10B, the resist film 300 illustrated in FIG. 9 is removed. FIG. 10A is a plan view and FIG. 10B is a cross-sectional view taken along the line 10B-10B.

Figure 11:
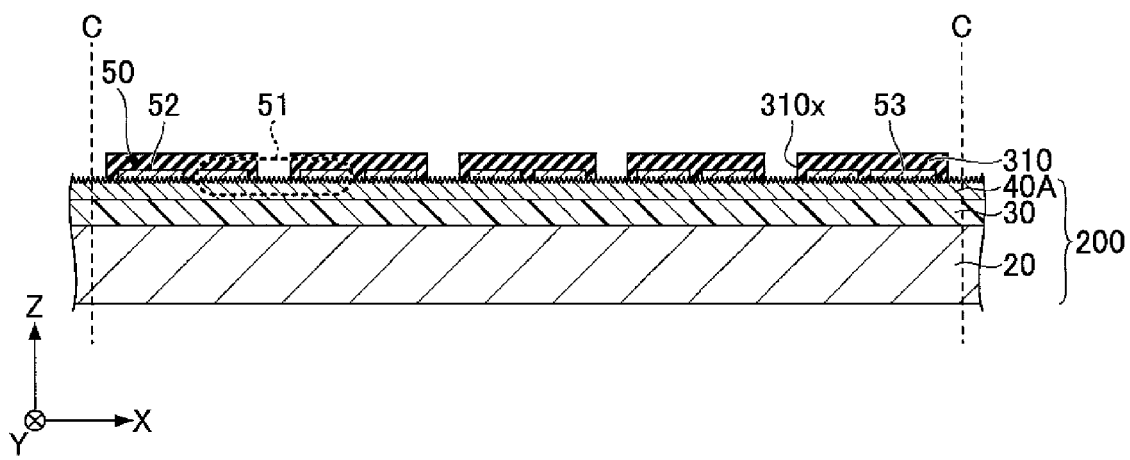
FIG. 11 illustrates the manufacturing process of the light-emitting element mounting package of the first embodiment.

Referring to FIG. 11, resist layers 310 corresponding to the wiring portions 41 to 45 of the light-emitting element mounting portions 40 are formed on the first surface of the metallic layer 40A. The resist layers 310 cover positions corresponding to the wiring portions 41 to 45 of the light-emitting element mounting portion 40 illustrated in FIG. 2 within each area surrounded by the cut lines C as illustrated in FIG. 5. The resist layers 310 may be formed with a process similar to the process of forming the resist layer 300 illustrated in FIG. 8.

Figure 12:
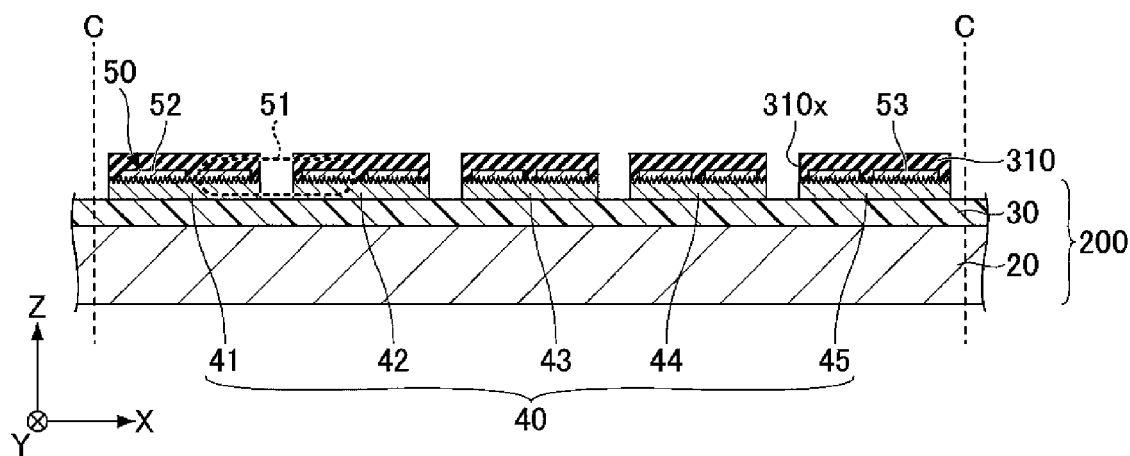
FIG. 12 illustrates the manufacturing process of the light-emitting element mounting package of the first embodiment.

Referring to FIG. 12, parts of the metallic layer 40A exposed through the opening portions 310x are removed. Thus, the light-emitting element mounting portions 40, in which the plural wiring portions 41 to 45 are arranged interposing the predetermined gaps, are formed. Said differently, the metallic layer 40A is shaped by being appropriately removed. Thus, a first part of the light-emitting element mounting area 51 belongs to a first wiring portion, and a second part of the light-emitting element mounting area 51 belongs to a second wiring portion adjacent to the first wiring portion. In a case where the metallic layer 40A is made of a copper foil, the metallic layer 40A can be removed by wet etching using, for example, aqueous ferric chloride, aqueous copper chloride, aqueous ammonium persulfate, or the like.

Figure 13A:
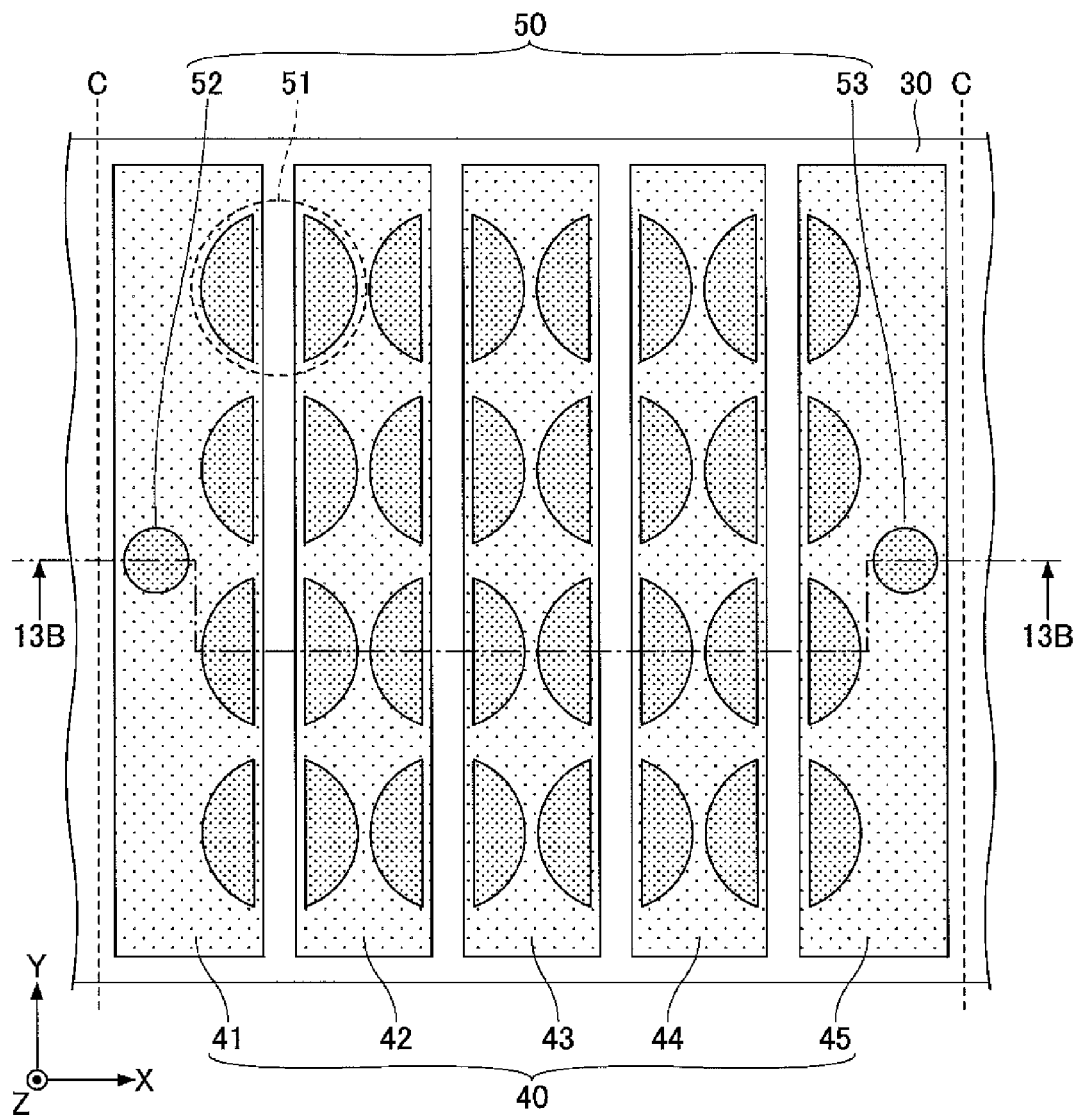
FIG. 13A illustrates the manufacturing process of the light-emitting element mounting package of the first embodiment.
Figure 13B:
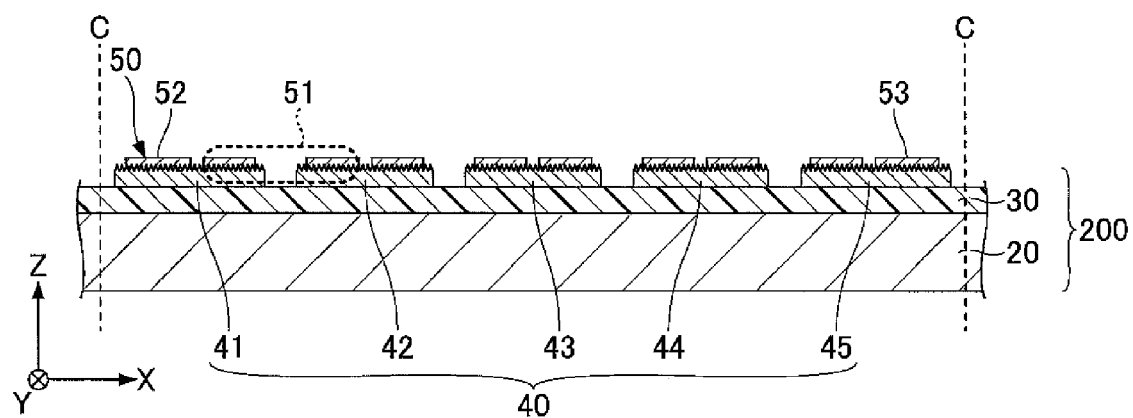
FIG. 13B illustrates a cross-sectional view of the light-emitting element mounting package illustrated in FIG. 13A taken along a line 13B-13B.

Referring to FIGS. 13A and 13B, the resist film 310 illustrated in FIG. 12 is removed. With this, the light-emitting element mounting portions 40, and the electroplating films 50 including the light-emitting element mounting areas 51, the first electrode 52, and the second electrode 53 are formed on the insulating layer 30. FIG. 13A is a plan view and FIG. 13B is a cross-sectional view taken along a line 13B-13B.

Figure 14:
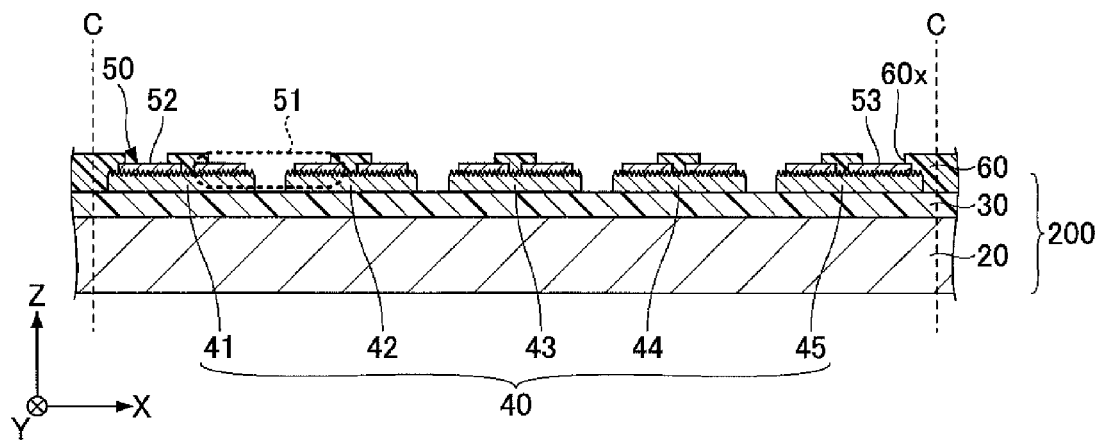
FIG. 14 illustrates a manufacturing process of the light-emitting element mounting package of the first embodiment.

Referring to FIG. 14, the reflective film 60 having opening portions 60x is formed on the insulating layer 30 so as to cover the light-emitting element mounting portions 40 and the electroplating films 50. Since the surfaces of the wiring portions 41 to 45 of the light-emitting element mounting portions 40 are roughened, contact (adhesion) between the surfaces of the wiring portions 41 to 45 and the reflective film 60 can be improved by an anchor effect. Parts of the light-emitting element mounting areas 51 are exposed through the opening portions 60x. The light-emitting element mounting areas 51 may be entirely exposed through the opening portions 60x.

The material of the reflective film 60 may be, for example, an epoxy insulating resin, a silicone insulating resin, or the like. Preferably, the color of the reflective film 60 is white in order to increase the reflectance ratio for light emitted by the light-emitting elements. The reflective film 60 can be colored white by adding filler such as titanium oxide to the reflective film 60 so that the reflective film 60 contains the filler. Instead of titanium oxide, a pigment such as $BaSO_4$ may be used to color the reflective film 60 white. The thickness of the reflective film 60 may be, for example, about 10 μm through about 50 μm.

In order to form the reflective film 60, an epoxy or silicone photosensitive insulating resin in liquid or paste form is coated on the insulating layer 30. Instead, an epoxy or silicone photosensitive insulating resin in film form is coated on the insulating layer 30. By irradiating the coated or laminated insulating resin with light and developing the coated or laminated insulating resin, the opening portions 60x are formed. With this, the reflective film 60 having the opening portions 60x is formed. An epoxy or silicone insulating resin in film form, in which the opening portions 60x are previously formed, may be laminated on the insulating layer 30. An epoxy or silicone non-photosensitive insulating resin, in which the opening portions 60x are previously formed, may be screen-printed to form the reflective film 60.

Figure 15:
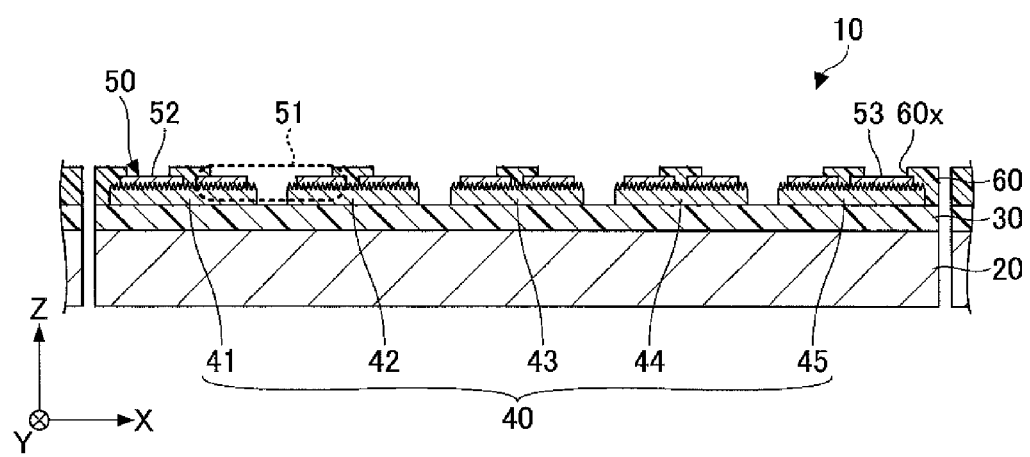
FIG. 15 illustrates a manufacturing process of the light-emitting element mounting package of the first embodiment.

Referring to FIG. 15, by cutting the structure illustrated in FIG. 14 along the cut lines C, plural light-emitting element mounting packages 10 can be completed. The structure illustrated in FIG. 14 can be cut by, for example, a dicing blade or processed by press molding using a metallic mold.

The product form for selling may be a light-emitting element mounting package 10 illustrated in FIG. 1 or the structure including light-emitting element mounting packages 10 as illustrated in FIG. 14.

Figure 16:
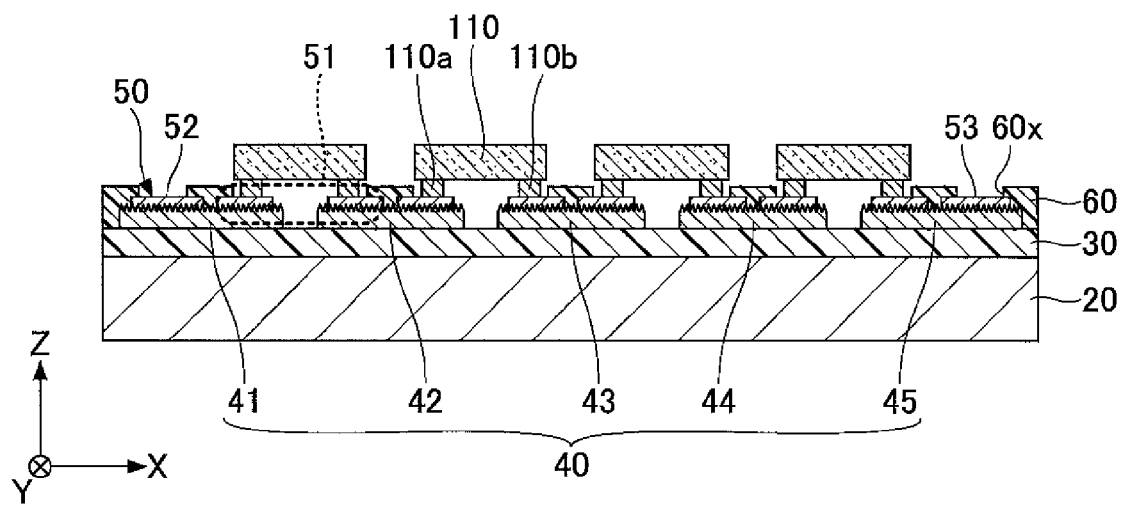
FIG. 16 illustrates a manufacturing process of the light-emitting element package of the first embodiment.

In a case where the LED module 100 is manufactured, LEDs 110 are mounted on the light-emitting element mounting areas 51 of the light-emitting element mounting package 10 as illustrated in FIG. 16. Each LED 110 has a bump 110a as one electric terminal and a bump 110b as the other electric terminal. For example, each LED 110 can be connected to corresponding light element mounting areas 51 by flip-chip bonding.

Figure 17:
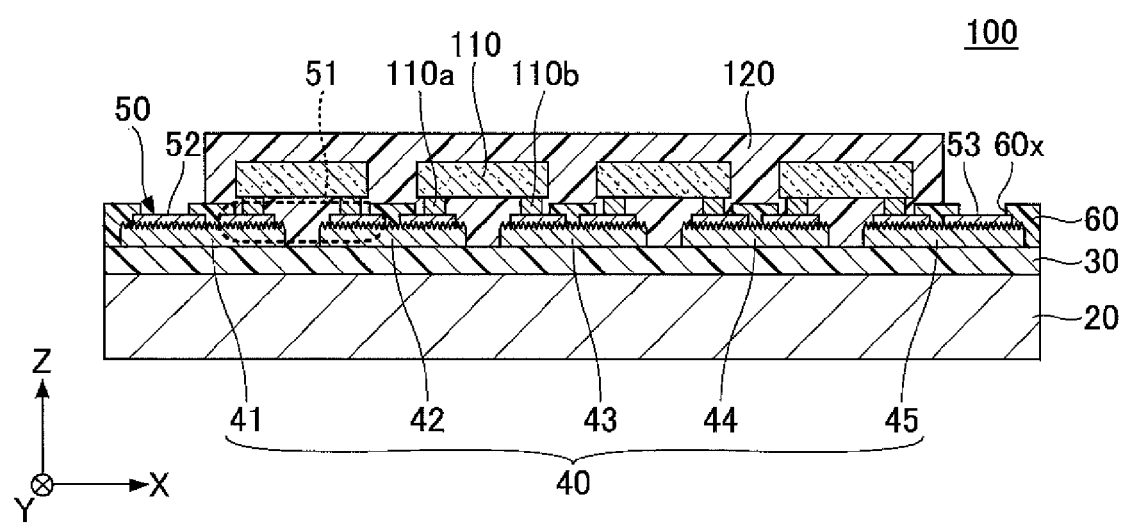
FIG. 17 illustrates the manufacturing process of the light-emitting element package of the first embodiment.

Referring to FIG. 17, the LEDs 110 are sealed by the sealing resin 120. The sealing resin 120 may be an epoxy or silicone insulating resin or the like containing a fluorescent material. The sealing resin 120 may be formed by, for example, transfer molding or potting. Thus, the LED module 100 can be manufactured. Instead of simultaneously sealing the plural LEDs 110, the LEDs 110 can be individually sealed.

Figure 18:
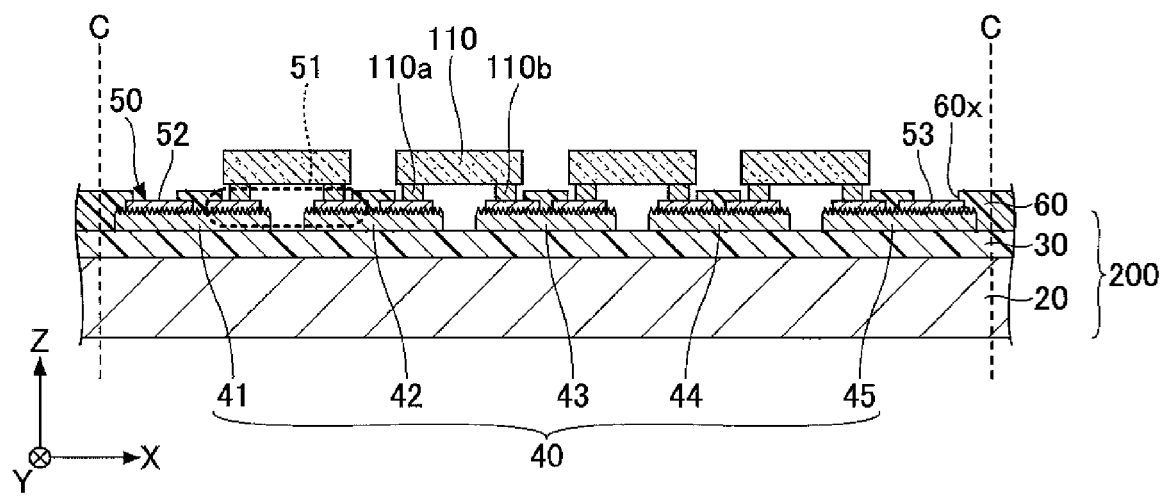
FIG. 18 illustrates the manufacturing process of the light-emitting element package of the first embodiment.
Figure 19:
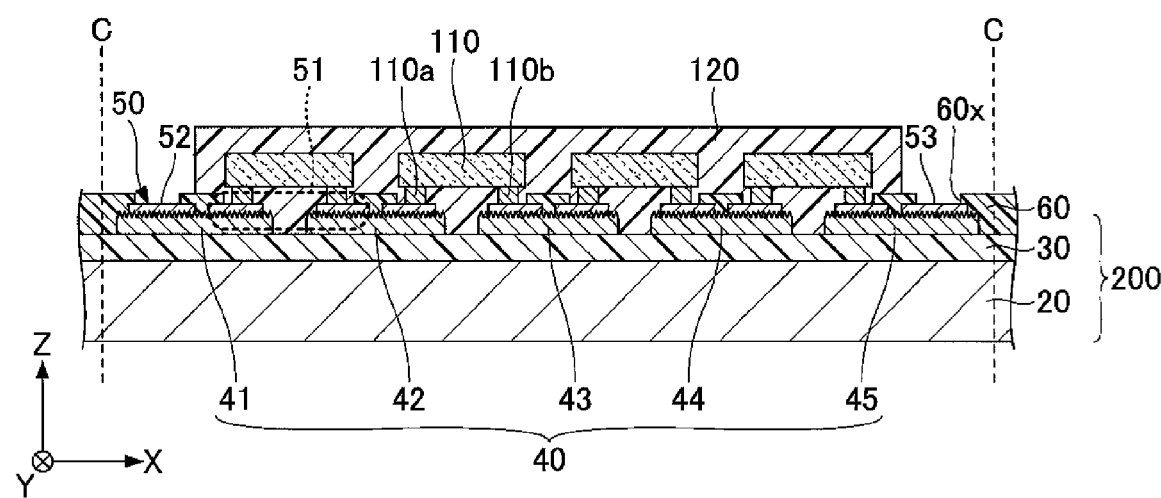
FIG. 19 illustrates the manufacturing process of the light-emitting element package of the first embodiment.
Figure 20:
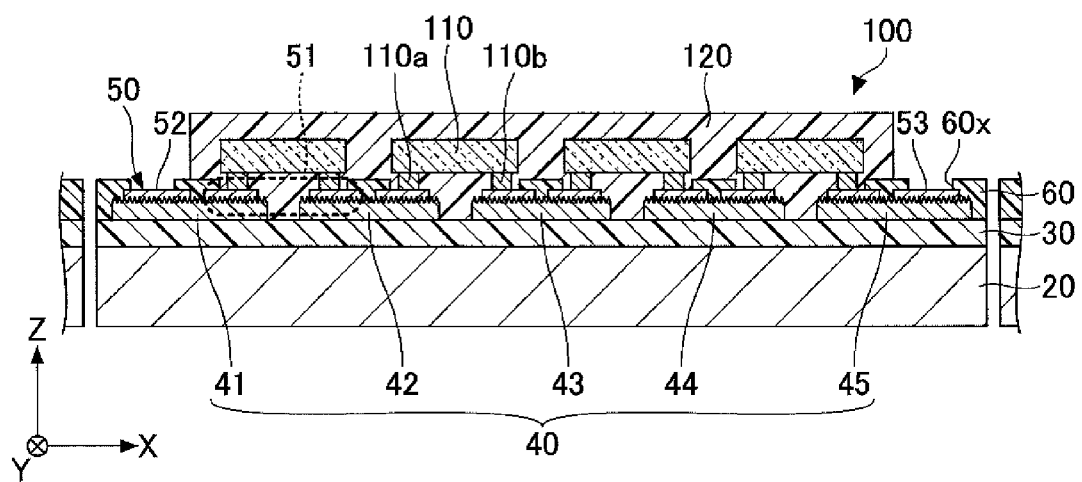
FIG. 20 illustrates the manufacturing process of the light-emitting element package of the first embodiment.
Figure 21:
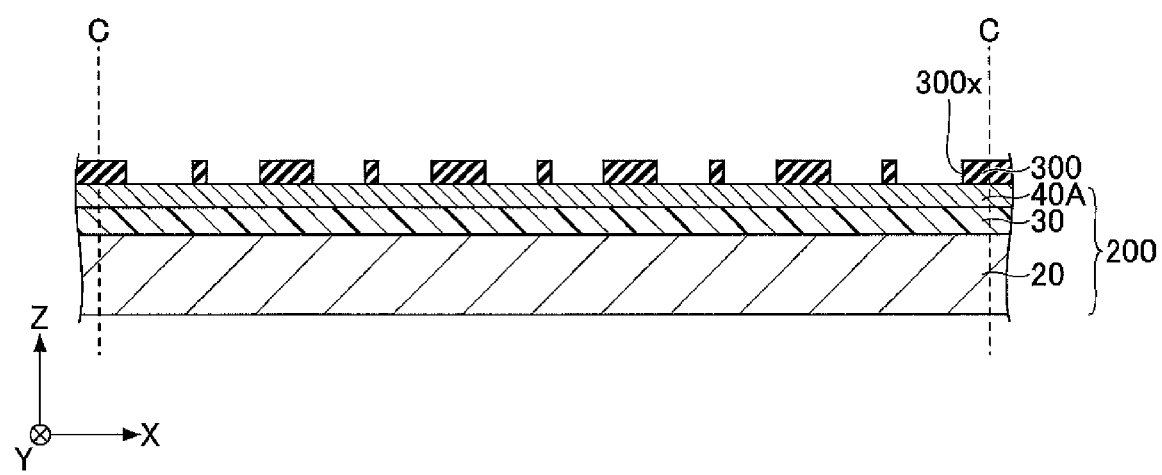
FIG. 21 illustrates a manufacturing process of a light-emitting element mounting package of a second embodiment.

When the LED module 100 is manufactured, the following processes may be instead employed. After the process illustrated in FIG. 14 and before cutting the structure along the cut lines C, plural LEDs 110 may be mounted on portions of the structure to be the light emitting element mounting packages 10 as illustrated in FIG. 18. Referring to FIG. 19, the LEDs 110 are sealed by the sealing resin 120 (in the portions of the structure to be the light emitting element mounting packages 10). Referring to FIG. 20, by cutting along the cut lines C illustrated in FIG. 19, the plural LED modules 100 are completed.

As described, in the light-emitting element mounting package 10 of the first embodiment, after forming the electroplating films 50 on the wiring portions 41-45 by electroplating, the reflective film 60 is formed. Unlike an exemplary light-emitting element mounting package, there is no process of forming a plating film on the wiring portions 41 to 45 exposed through the reflective film 60 by electroless plating after the reflective film 60 is formed in the first embodiment. As a result, unlike the exemplary light-emitting element mounting package, the reflective film 60 is not dipped into a plating solution. Therefore, it is possible to prevent property degradation of the reflective film. Specifically, the reflectance ratio of the reflective film can be prevented from degrading.

The reflective film of the exemplary light-emitting element mounting package is dipped into the plating solution. Then, the constituent forming the reflective film may elute inside the plating solution to thereby degrade the quality of the plating solution. Since the reflective film 60 is not dipped into a plating solution in the light-emitting element mounting package of the first embodiment, it is possible to prevent the quality of the plating solution from degrading.

Further, the light-emitting element mounting areas 40 are formed by the electroplating films. Therefore, in comparison with a case where the light-emitting element mounting areas are formed by the electroplating films, it is possible to form the plating having a stable quality thereby improving connection reliability between the light-emitting elements 110 and the light-emitting element mounting areas 51 in comparison with a case where the light-emitting element mounting areas are formed by an electroless plating film.

[b] Second Embodiment

Within the second embodiment, an exemplary manufacturing method of the light-emitting element mounting package different from the first embodiment is exemplified. In the second embodiment, explanation of constructional elements the same as those described in the above description of the first embodiment is omitted.

FIGS. 21 to 29 illustrate a manufacturing process of a light emitting element mounting package 10 of the second embodiment. First, the processes illustrated in FIGS. 5 and 6 are performed. Thereafter, referring to FIG. 21, the resist layer 300 having the opening portions 300x corresponding to the electroplating films 50 is formed on a first surface of the metallic layer 40A which is not roughened. The resist layer 300 is formed in a manner similar to the process illustrated in FIG. 8.

Figure 22:
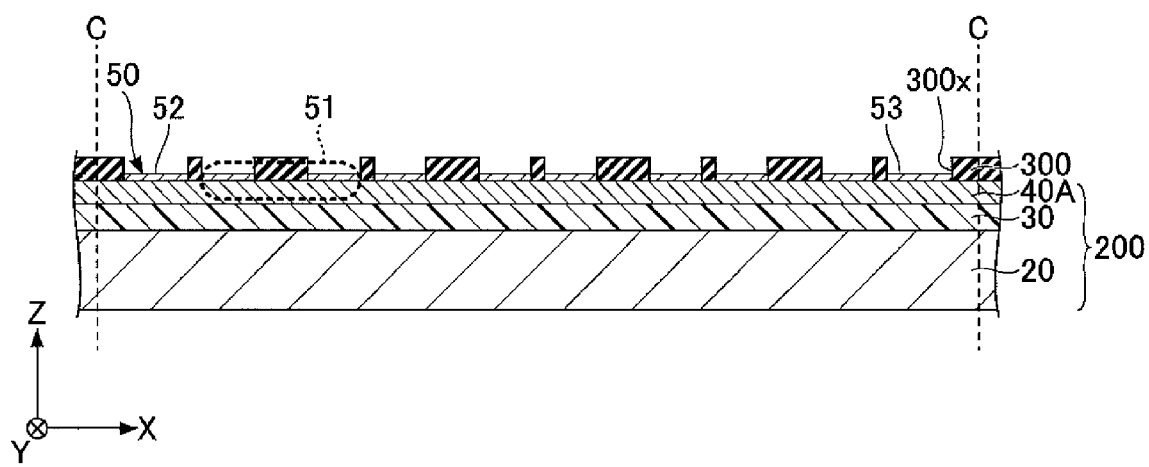
FIG. 22 illustrates the manufacturing process of the light-emitting element mounting package of the second embodiment.

Referring to FIG. 22, in a manner similar to the process illustrated in FIG. 9, electroplating films 50 are formed inside the opening portions 300x on the first surface of the metallic layer 40A by electroplating using the metallic layer 40A as a power supply layer. In the electroplating films 50, the type, the thickness and so on are as described above. Because the reflectance ratios of an Ag film and an Ag alloy film are high, if the uppermost layers of the electroplating films 50 are formed to be an Ag film or an Ag alloy film, the reflectance ratio of light emitted by a light-emitting element can be preferably increased.

Figure 23:
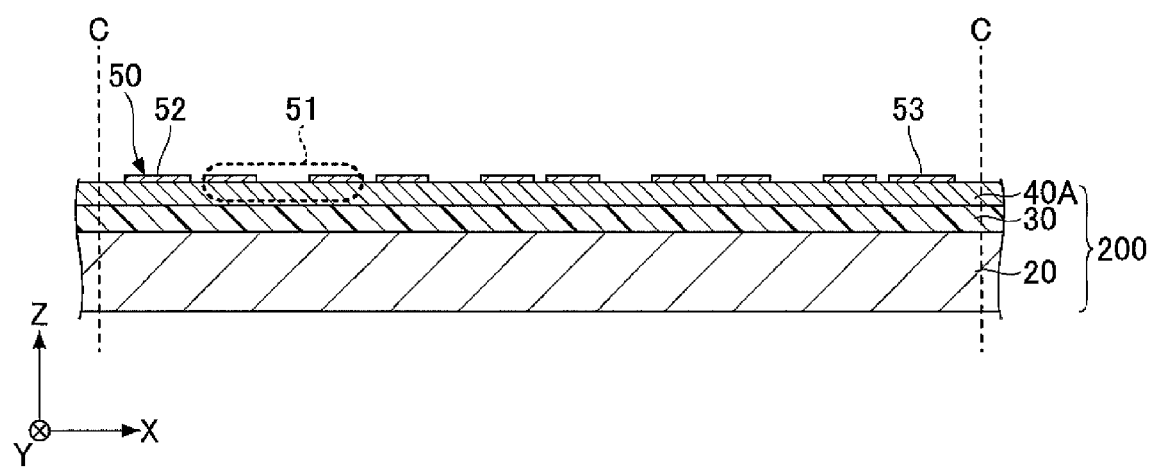
FIG. 23 illustrates the manufacturing process of the light-emitting element mounting package of the second embodiment.

Referring to FIG. 23, in a manner similar to the process illustrated in FIG. 10, the resist layer 300 is removed. Then, the electroplating films 50 including light-emitting element mounting areas 51, a first electrode 52 and a second electrode 53 are formed on the first surface of the metallic layer 40A. The plan view of the structure illustrated in FIG. 23 is similar to FIG. 10A.

Figure 24:
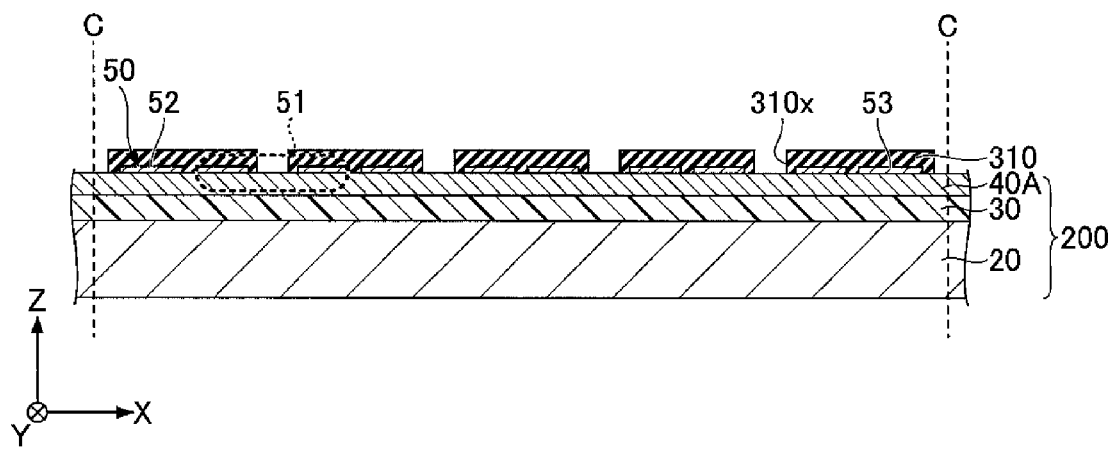
FIG. 24 illustrates the manufacturing process of the light-emitting element mounting package of the second embodiment.

Referring to FIG. 24, in a manner similar to the process illustrated in FIG. 11, resist layers 310 corresponding to wiring portions 41 to 45 of the light-emitting element mounting portions 40 are formed on the first surface of the metallic layer 40A. Next, referring to FIG. 25, in a manner similar to the process illustrated in FIG. 12, the metallic layer 40A exposed through the opening portions 310x is removed thereby forming the light-emitting element mounting portions 40 including the wiring portions 41 to 45.

Figure 25:
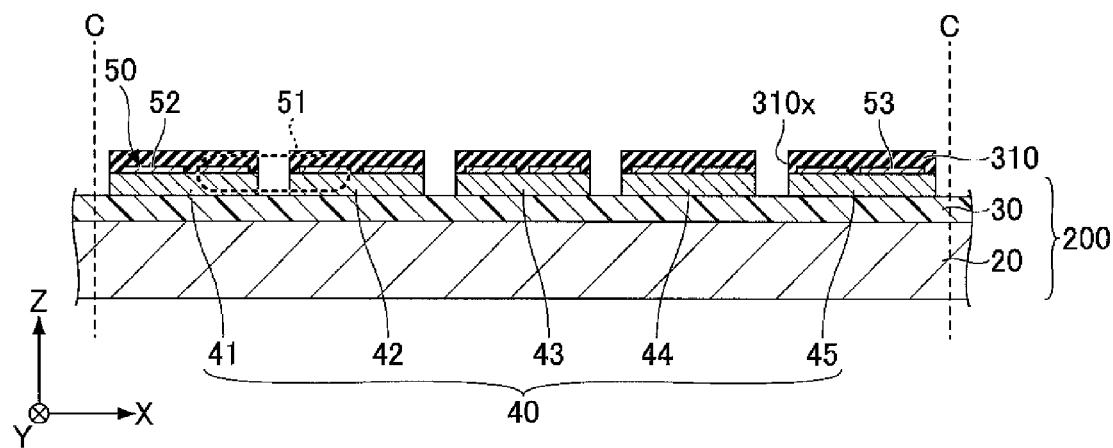
FIG. 25 illustrates the manufacturing process of the light-emitting element mounting package of the second embodiment.
Figure 26:
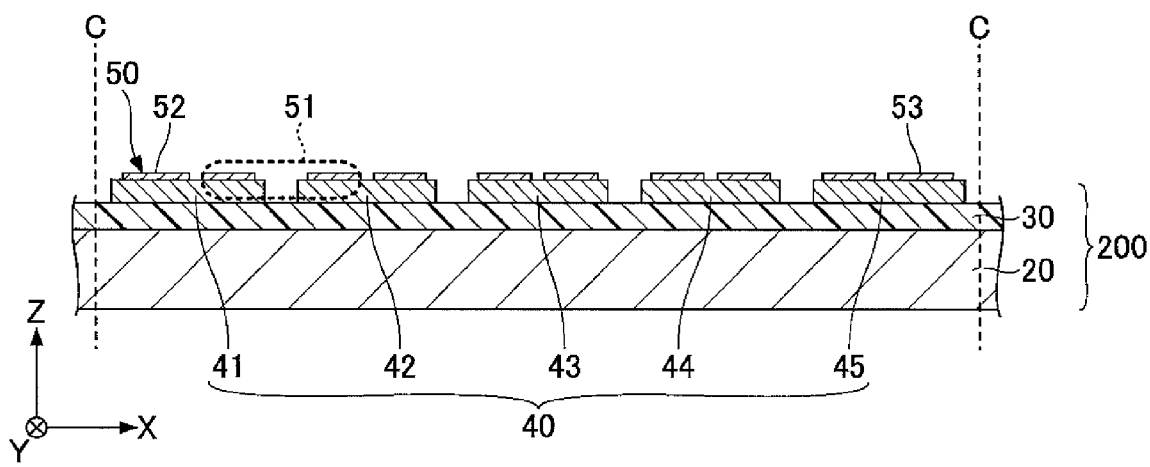
FIG. 26 illustrates the manufacturing process of the light-emitting element mounting package of the second embodiment.

Referring to FIG. 26, in a manner similar to the process illustrated in FIG. 13, the resist layers 310 illustrated in FIG. 25 are removed. With this, the light-emitting element mounting portions 40 which include the wiring portions 41 to 45, and the electroplating films 50 including the light-emitting element mounting areas 51, the first electrode 52, and the second electrode 53 are formed on the insulating layer 30. The plan view of the structure illustrated in FIG. 26 is similar to FIG. 13A.

Figure 27:
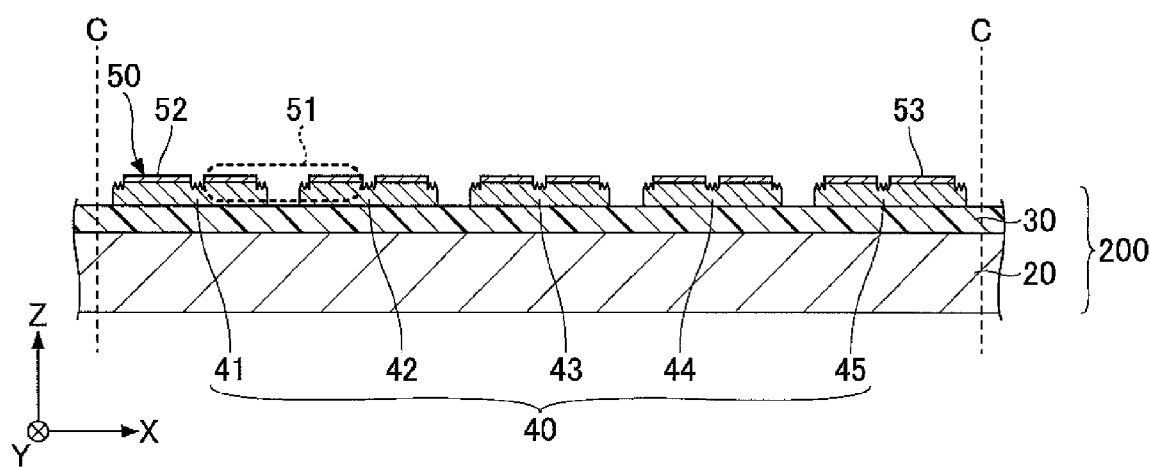
FIG. 27 illustrates the manufacturing process of the light-emitting element mounting package of the second embodiment.

Referring to FIG. 27, parts of first surfaces of the wiring portions 41 to 45 of the light-emitting element mounting portions 40, in which the electroplating films 50 are not formed, are roughened. Here, the first surfaces are opposite to surfaces contacting the insulating layer 30. The method of roughening the first surfaces of the wiring portions 41 to 45 of the light-emitting element mounting portions 40 may be similar to the process illustrated in FIG. 7. In the CZ process, the chemical polishing (micro-etching) can be selectively provided for copper. Therefore, it is possible to preferably roughen parts, on which the electroplating films 50 are not formed, on the first surfaces of the wiring portions 41 to 45 can be preferably etched.

Figure 28:
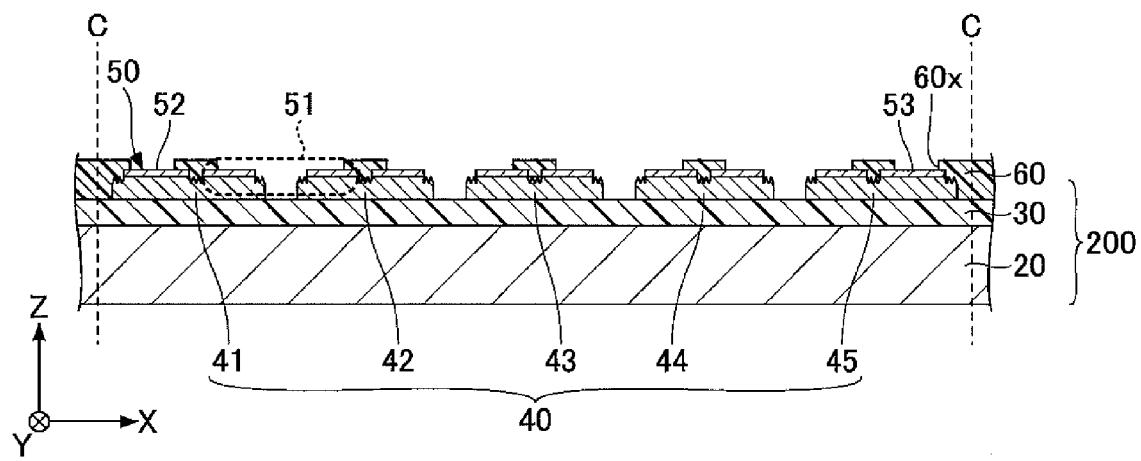
FIG. 28 illustrates the manufacturing process of the light-emitting element mounting package of the second embodiment.

Referring to FIG. 28, in a manner similar to the process illustrated in FIG. 14, a reflective film 60 having opening portions 60x is formed on the insulating layer 30 so as to cover the light-emitting element mounting portions 40 and the electroplating films 50. Since the first surfaces of the wiring portions 41 to 45 of the light-emitting element mounting portions 40, on which the electroplating films 50 are not formed, are roughened, contact (adhesion) between the first surfaces of the wiring portions 41 to 45 and the reflective film 60 can be improved by an anchor effect. Parts of the light-emitting element mounting areas 51 are exposed through the opening portions 60x. The light-emitting element mounting areas 51 may be entirely exposed through the opening portions 60x.

Figure 29:
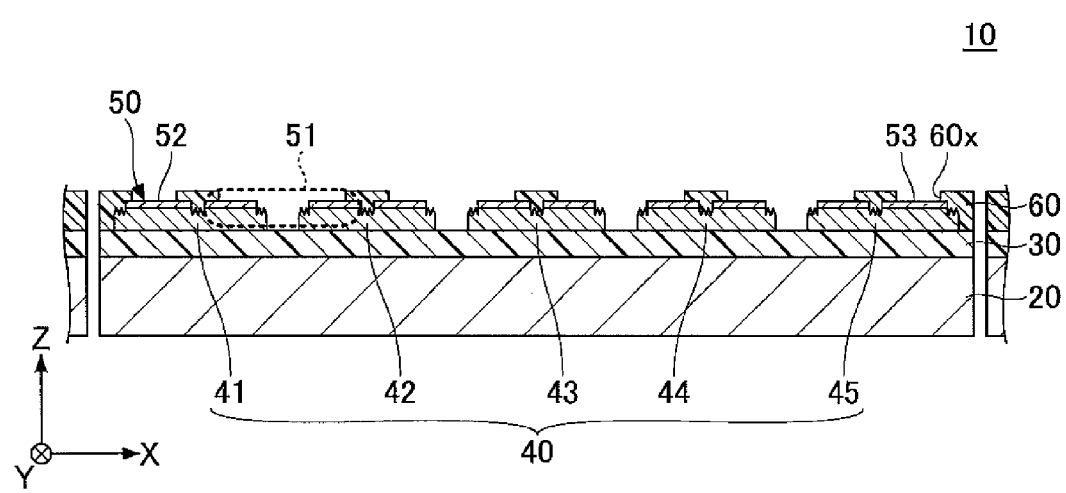
FIG. 29 illustrates the manufacturing process of the light-emitting element mounting package of the second embodiment.

Referring to FIG. 29, by cutting the structure illustrated in FIG. 28 along the cut lines C, plural light-emitting element mounting packages 10 can be completed. The structure illustrated in FIG. 28 can be cut by, for example, a dicing blade.

As described, the roughening can be provided on the metallic layer 40A or on parts of the surfaces of the wiring portions 41 to 45 after forming the wiring portions 41 to 45 made of the metallic layer 40A.

[c] Third Embodiment

Within the third embodiment, an exemplary manufacturing method of a light-emitting element mounting package different from the first embodiment is exemplified. In the third embodiment, explanation of constructional elements the same as those described in the above description is omitted.

FIGS. 30A to 37B illustrate a manufacturing process of a light emitting element mounting package 10 of the third embodiment. First, the processes illustrated in FIGS. 5 and 6 of the first embodiment are performed. Thereafter, in the process illustrated in FIG. 30A, the resist layer 320 is formed on the first surface of the metallic layer 40A, the first surface of which is not roughened. A resist layer 320 is formed on an area corresponding to wiring portions 41 to 45 of light-emitting element mounting portions 40 and areas corresponding to a frame portion 210 and a connecting portion 220. The resist layer 320 is formed in a manner similar to the process of forming the resist layer 300 illustrated in FIG. 8.

Figure 30A:
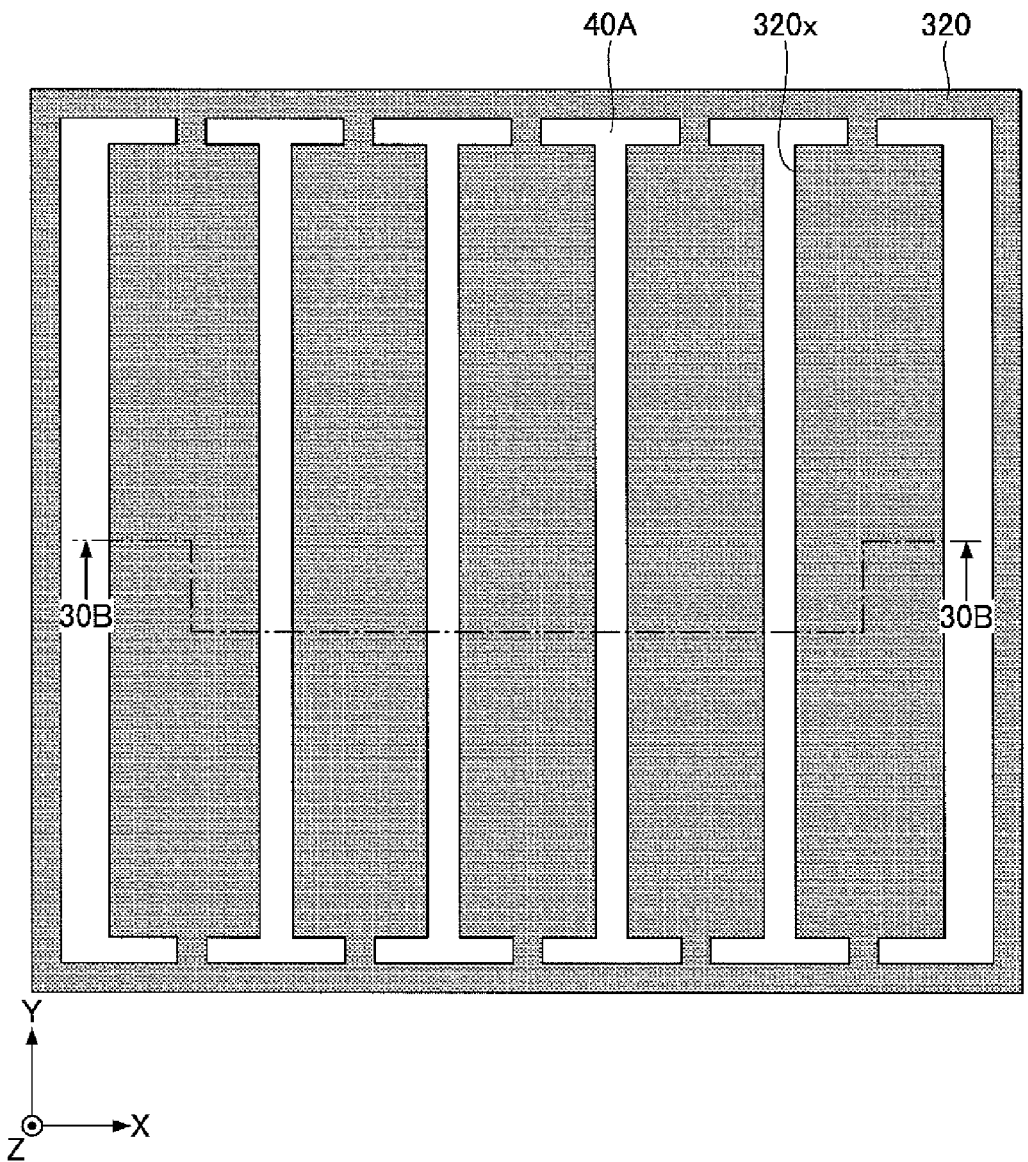
FIG. 30A illustrates a manufacturing process of a light-emitting element mounting package of a third embodiment.
Figure 30B:
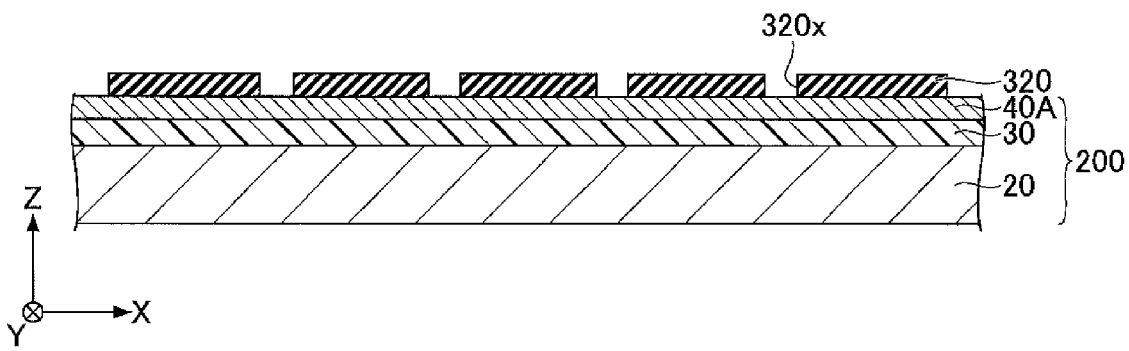
FIG. 30B illustrates a cross-sectional view of the light-emitting element mounting package illustrated in FIG. 30A taken along a line 30B-30B.

Before the process illustrated in FIG. 30A, in a manner similar to the process illustrated in FIG. 7, a first surface of the metallic layer 40A may be roughened. In this case, the process illustrated in FIG. 32 is unnecessary.

Figure 31A:
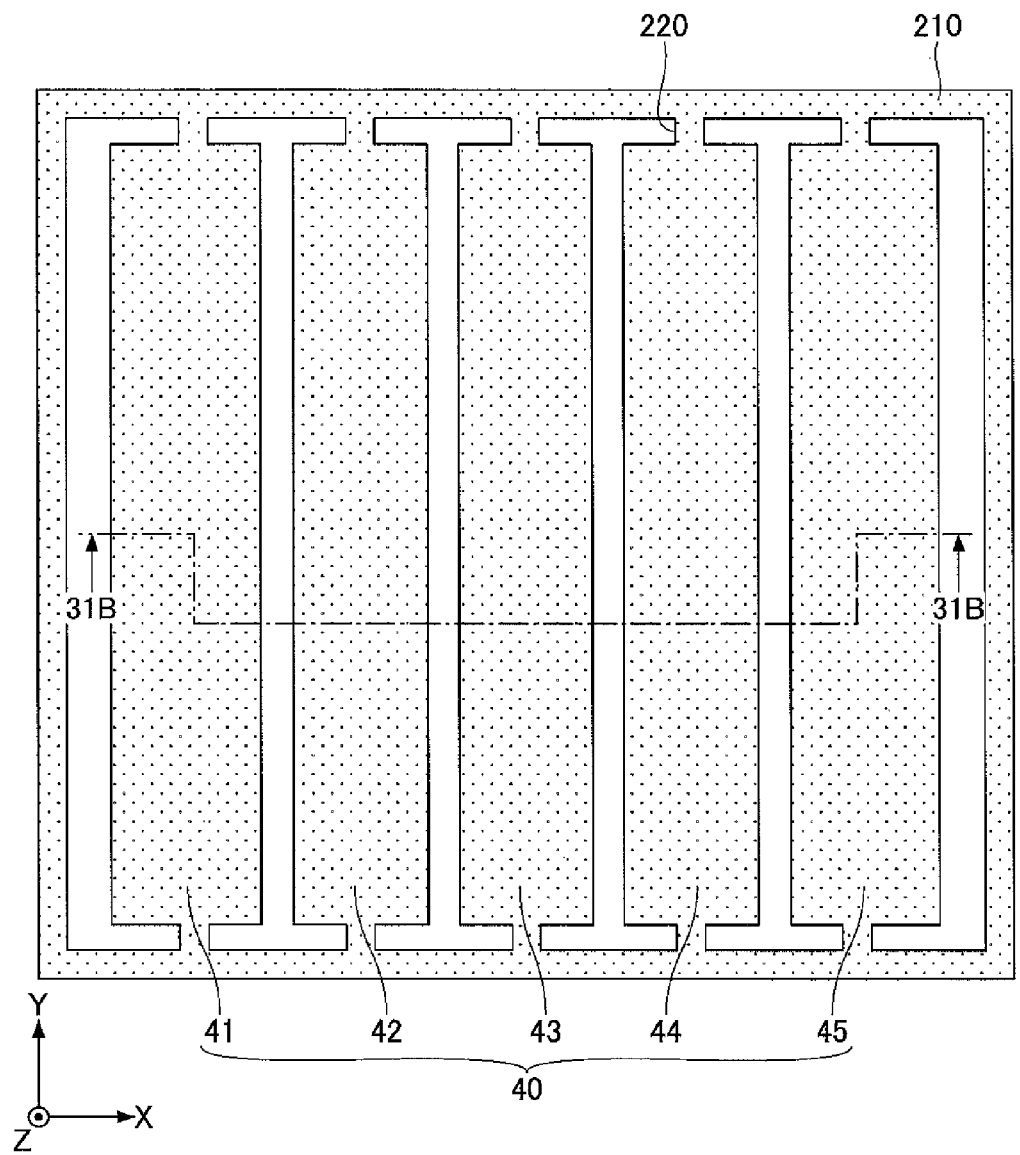
FIG. 31A illustrates the manufacturing process of the light-emitting element mounting package of the third embodiment.
Figure 31B:
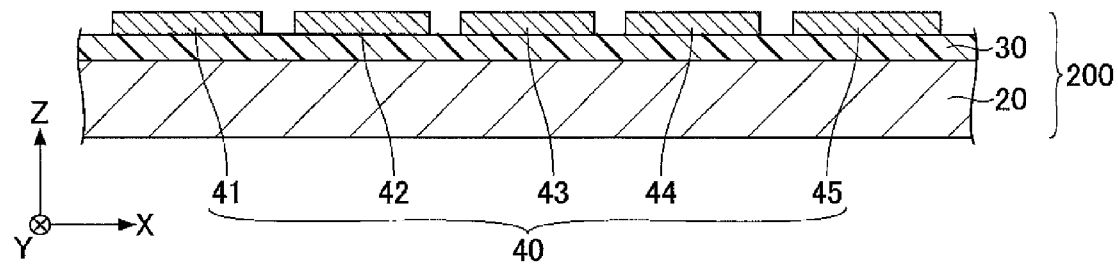
FIG. 31B illustrates a cross-sectional view of the light-emitting element mounting package illustrated in FIG. 31A taken along a line 31B-31B.

Referring to FIGS. 31A and 31B, the metallic layer 40A exposed through opening portions 320x are removed and thereafter the resist layer 320 is removed. In a case where the metallic layer 40A is made of a copper foil, the metallic layer 40A can be removed by wet etching using, for example, aqueous ferric chloride, aqueous copper chloride, aqueous ammonium persulfate, or the like. Thus, wiring portions 41 to 45 of the light-emitting element mounting portions 40 are connected to the frame portion 210 via the connecting portion 220. Said differently, the light-emitting element mounting portions 40 including plural wiring portions 41 to 45 arranged while interposing predetermined gaps between the plural wiring portions 41 to 45, the frame portion 210 and connecting portions 220, which serve as a bus line used for electroplating the wiring portions 41 to 45.

Figure 32:
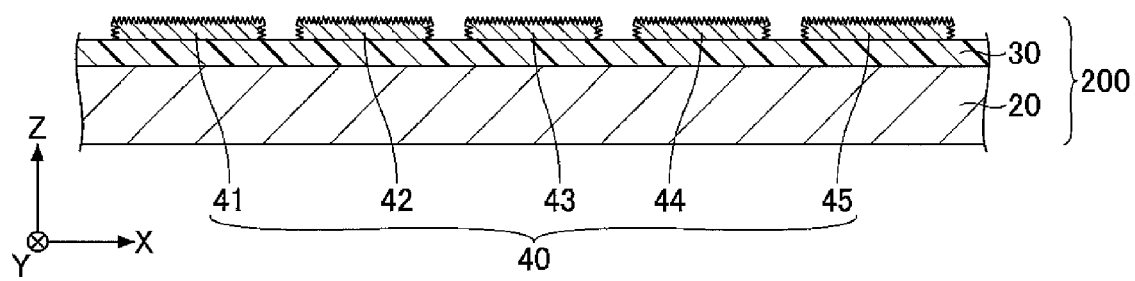
FIG. 32 illustrates the manufacturing process of the light-emitting element mounting package of the third embodiment.
Figure 33A:
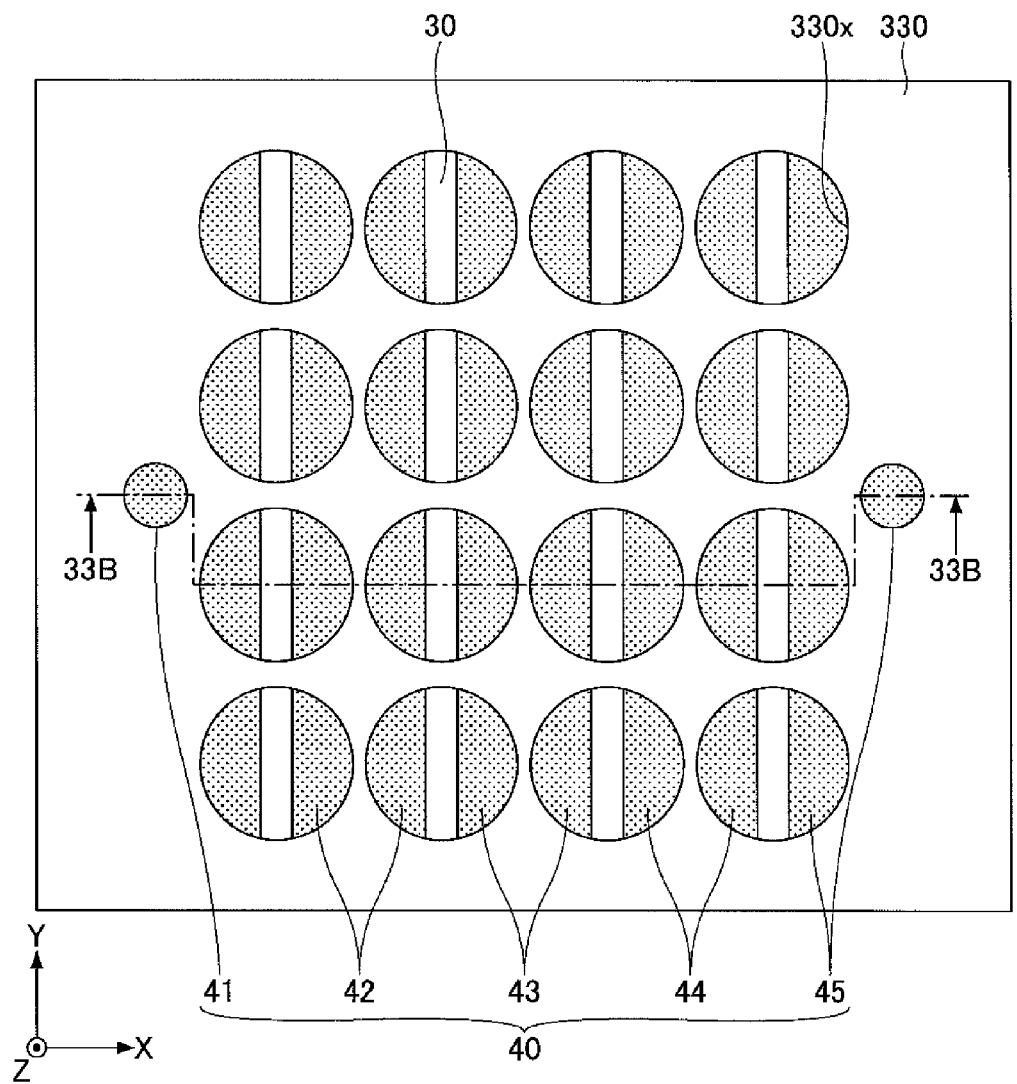
FIG. 33A illustrates the manufacturing process of the light-emitting element mounting package of the third embodiment.
Figure 33B:
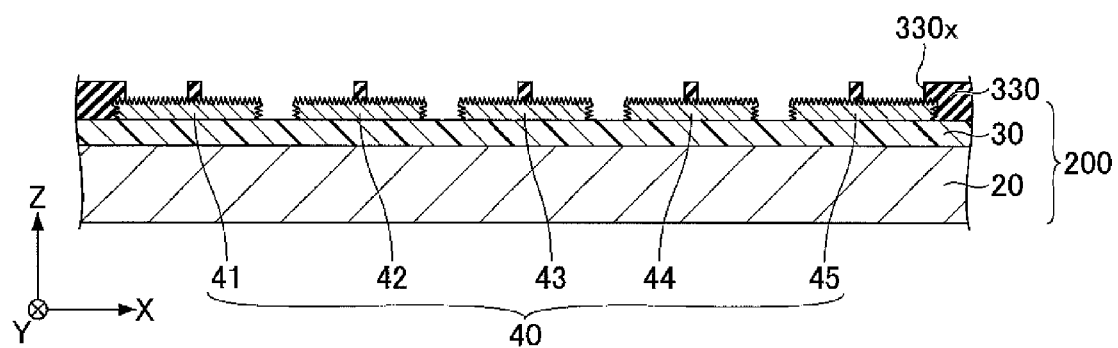
FIG. 33B illustrates a cross-sectional view of the light-emitting element mounting package illustrated in FIG. 33A taken along a line 33B-33B.

Referring to FIG. 32, first surfaces of the wiring portions 41 to 45 of the light-emitting element mounting portions 40, which first surfaces are opposite to surfaces contacting the insulating layer 30), and side surfaces of the wiring portions 41 to 45 are roughened. In comparison with the first and second embodiments, the side surfaces of the wiring portions 41 to 45 are additionally roughened. Here, the first surfaces are opposite to surfaces contacting the insulating layer 30. The method of roughening the first surfaces and the side surfaces of the wiring portions 41 to 45 of the light-emitting element mounting portions 40 may be similar to the process illustrated in FIG. 7. Referring to FIGS. 33A and 33B, a resist layer 330 having opening portion 330x corresponding to electroplating films 50 is formed. The resist layer 330 is formed in a manner similar to the process of forming the resist layer 300 illustrated in FIG. 8.

Figure 34A:
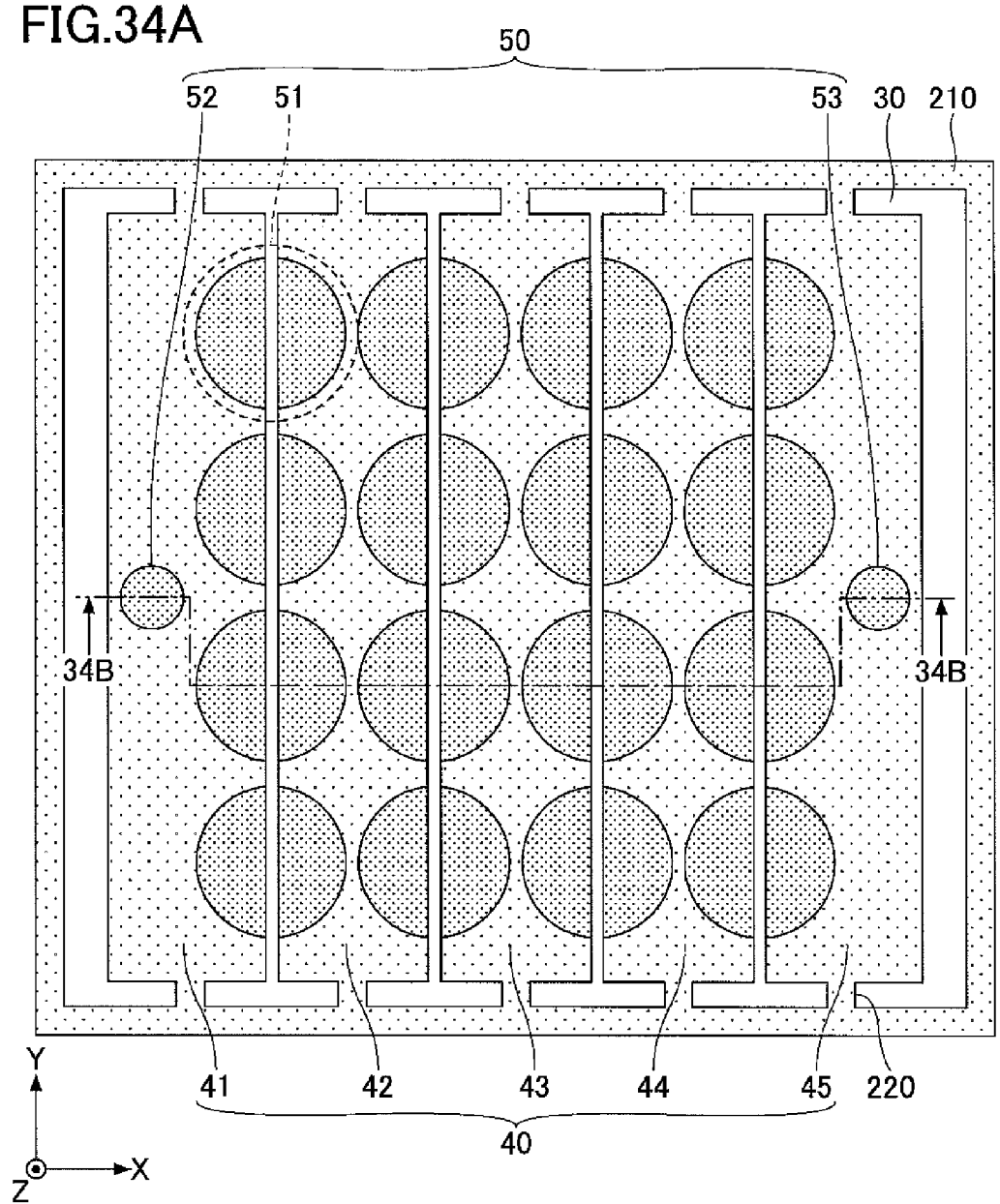
FIG. 34A illustrates the manufacturing process of the light-emitting element mounting package of the third embodiment.
Figure 34B:
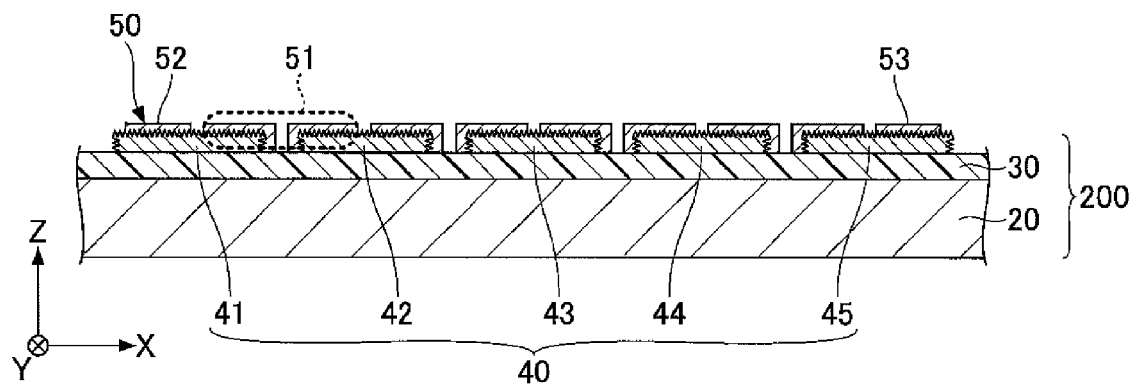
FIG. 34B illustrates a cross-sectional view of the light-emitting element mounting package illustrated in FIG. 34A taken along a line 34B-34B.

Referring to FIGS. 34A and 34B, the electroplating films 50 are formed inside the opening portions 330x on the first surface of the wiring portions 41 to 45 of the light-emitting element mounting portion 40 by electroplating using the frame portion 210 and the connecting portions 220 (the frame portion 210 and the connecting portions 220 form a bus line). Thereafter, the resist film 330 is removed. In this process, the light-emitting element mounting areas 51 made of the pairs of electroplating films 50 separated by the predetermined gaps are formed. Meanwhile, a first electrode 52 and a second electrode 53 are also formed. In comparison with the first and second embodiments, the electroplating films 50 are formed not only on the first surfaces of the wiring portions 41 to 45 but also on the roughened side surfaces of the wiring portions 41 to 45. In the electroplating films 50, the type, the thickness and so on are as described above. Because the reflectance ratios of an Ag film and an Ag alloy film are high, if the uppermost layers (including the first surfaces and the side surfaces) of the electroplating films 50 are formed to be an Ag film or an Ag alloy film, the reflectance ratio of light emitted by a light-emitting element can be preferably increased.

Figure 35A:
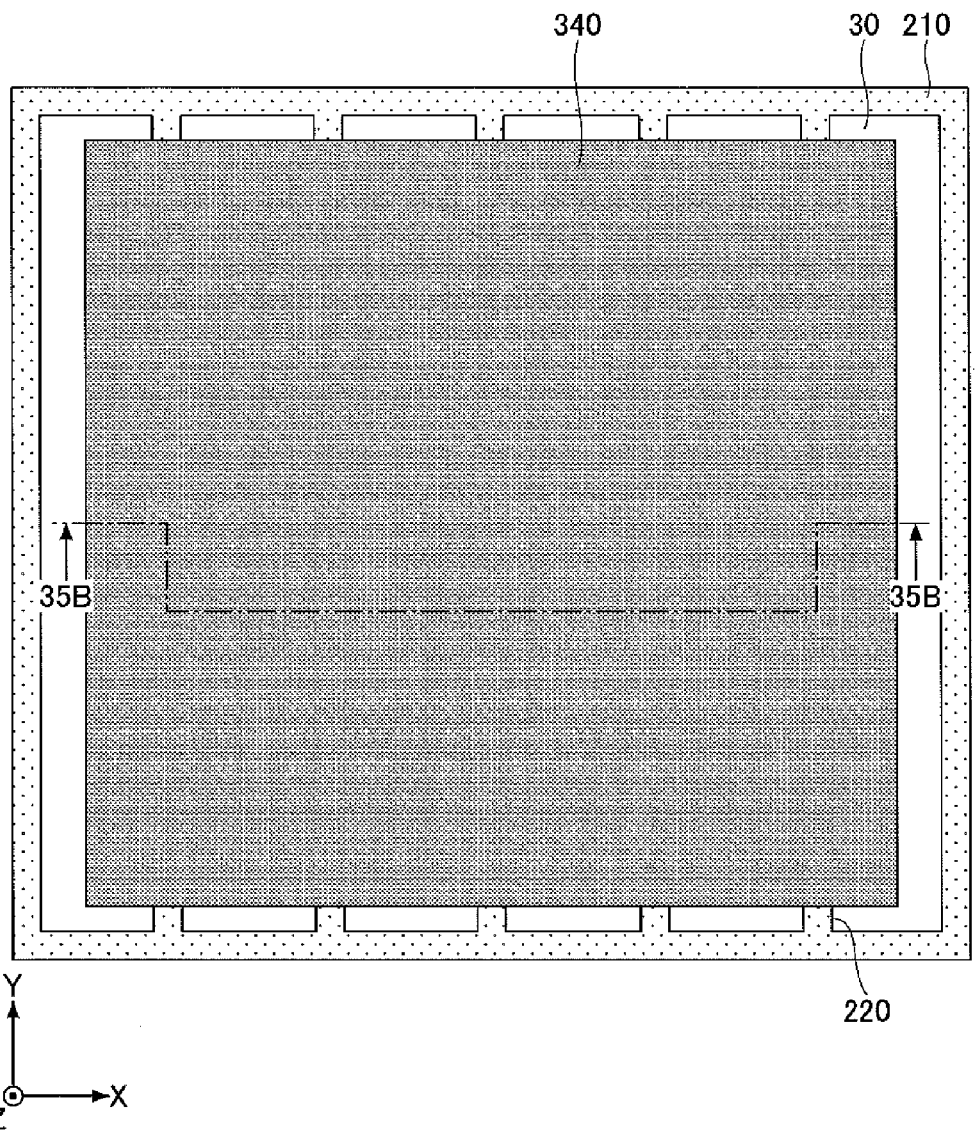
FIG. 35A illustrates the manufacturing process of the light-emitting element mounting package of the third embodiment.
Figure 35B:
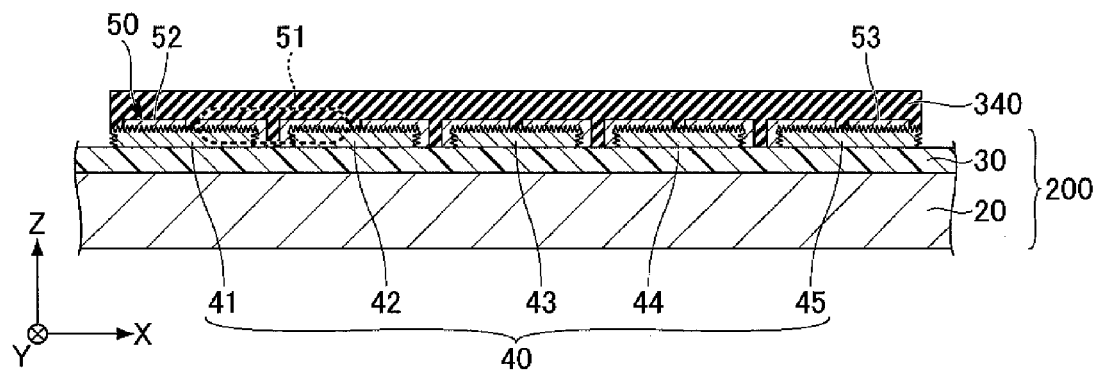
FIG. 35B illustrates a cross-sectional view of the light-emitting element mounting package illustrated in FIG. 35A taken along a line 35B-35B.
Figure 36A:
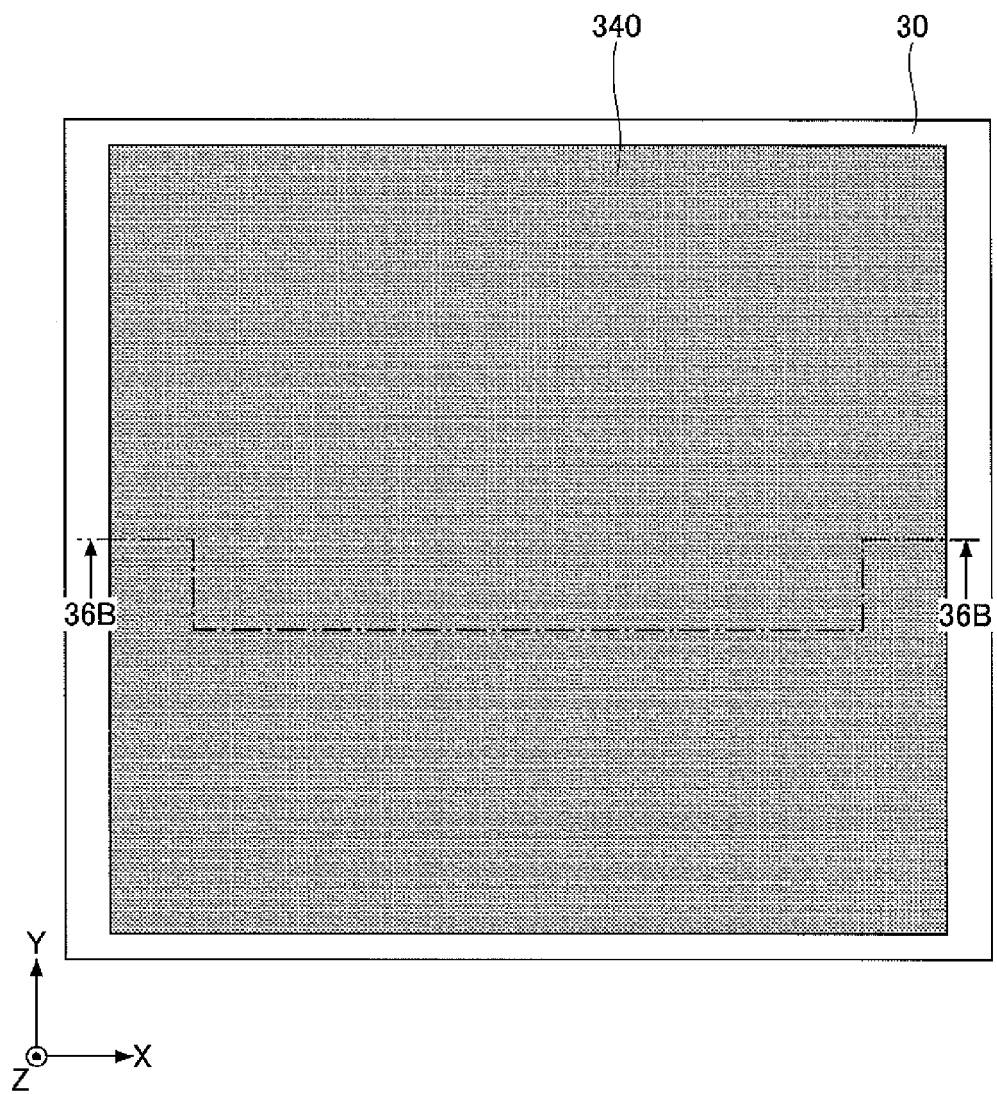
FIG. 36A illustrates the manufacturing process of the light-emitting element mounting package of the third embodiment.
Figure 36B:
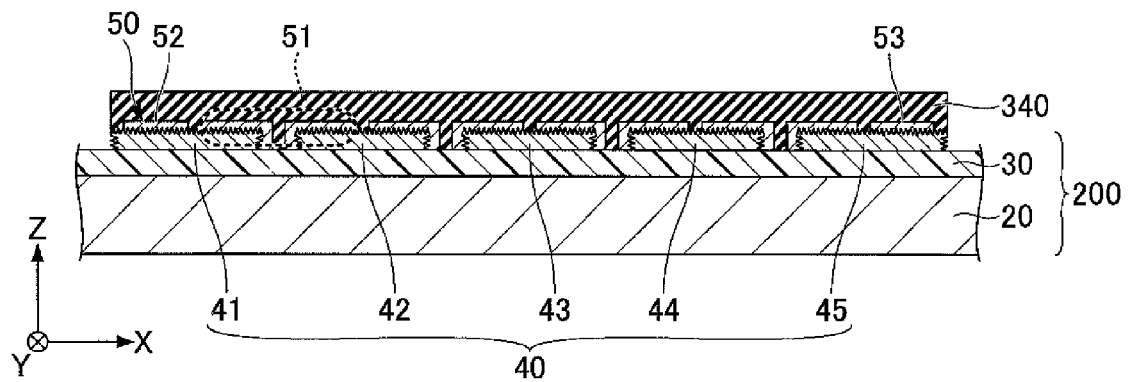
FIG. 36B illustrates a cross-sectional view of the light-emitting element mounting package illustrated in FIG. 36A taken along a line 36B-36B.

Next, referring to FIGS. 35A and 35B, a resist layer 340 is formed on the wiring portions 41 to 45 of the light-emitting element mounting portion 40 and the insulating layer 30 between the wiring portions 41 to 45. The resist layer 340 is formed in a manner similar to the process of forming the resist layer 300 illustrated in FIG. 8. Next, referring to FIGS. 36A and 36B, the bus line including the frame portion 210 and the connecting portions 220 are removed. In a case where the frame portion 210 and the connecting portions 220 are made of a copper foil, the metallic layer 40A can be removed by wet etching using, for example, aqueous ferric chloride, aqueous copper chloride, aqueous ammonium persulfate, or the like.

Figure 37A:
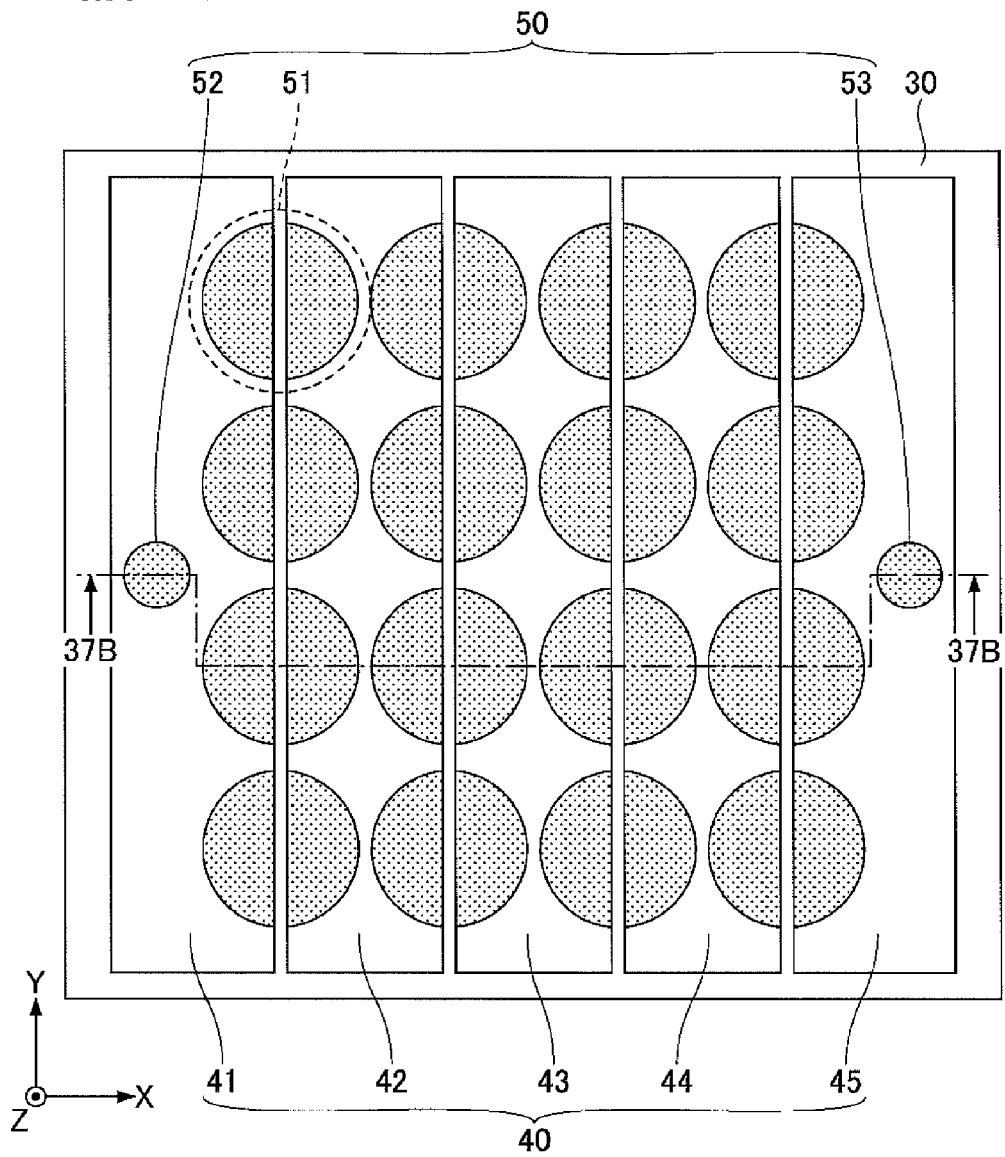
FIG. 37A illustrates the manufacturing process of the light-emitting element mounting package of the third embodiment.
Figure 37B:
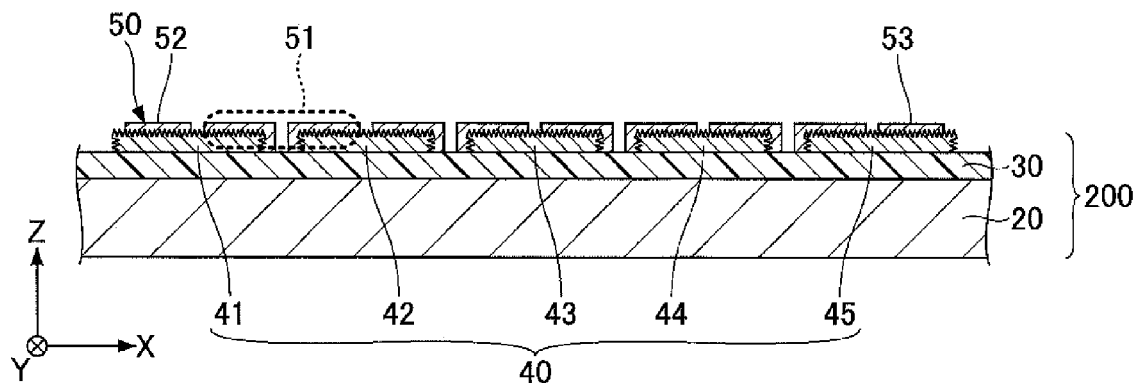
FIG. 37B illustrates a cross-sectional view of the light-emitting element mounting package illustrated in FIG. 37A taken along a line 37B-37B.

Referring to FIGS. 37A and 37B, the resist film 340 is removed. After the process illustrated in FIGS. 37A and 37B, in a manner similar to the process illustrated in FIG. 14, a reflective film 60 having opening portions 60x is formed on the insulating layer 30 so as to cover the light-emitting element mounting portions 40 and the electroplating films 50. Then, this structure is cut along cut lines C as illustrated in FIG. 5. Thus, the plural light-emitting element mounting package 10 are completed.

As described, the metallic layer 40A may be used to provide electroplating on the surface of the metallic layer 40A. Instead, the wiring portions 41 to 45 and the bus line (including the frame portion 210 and the connecting portions 220) may be formed from the metallic layer 40A. Then, electroplating may be provided on the surfaces of the wiring portions 41 to 45 using the bus line.

The light-emitting element mounting packages 10 do not have the bus line as the product form for sellining since there is the process of removing the bus line after electroplating the electroplating film 50. Therefore, end faces of the bus line are not exposed from side faces of the light-emitting element mounting packages 10 even after dicing the structure to obtain the light-emitting element mounting packages 10. If the end faces of the bus line are exposed on the side surfaces of the light-emitting element mounting packages 10, when the distances between the end faces of the bus line and the side surfaces of the metallic plate are close, a short-circuit between the end faces of the bus line and the side surfaces of the metallic plate may occur with a burr. In the light-emitting element mounting package 10 of the third embodiment, such a problem can be prevented.

[d] Fourth Embodiment

Within the fourth embodiment, an example of the wiring portions having a pattern different from the pattern of the first embodiment is illustrated. Within the fourth embodiment, explanation of constructional elements the same as those described in the above description is omitted.

Figure 38:
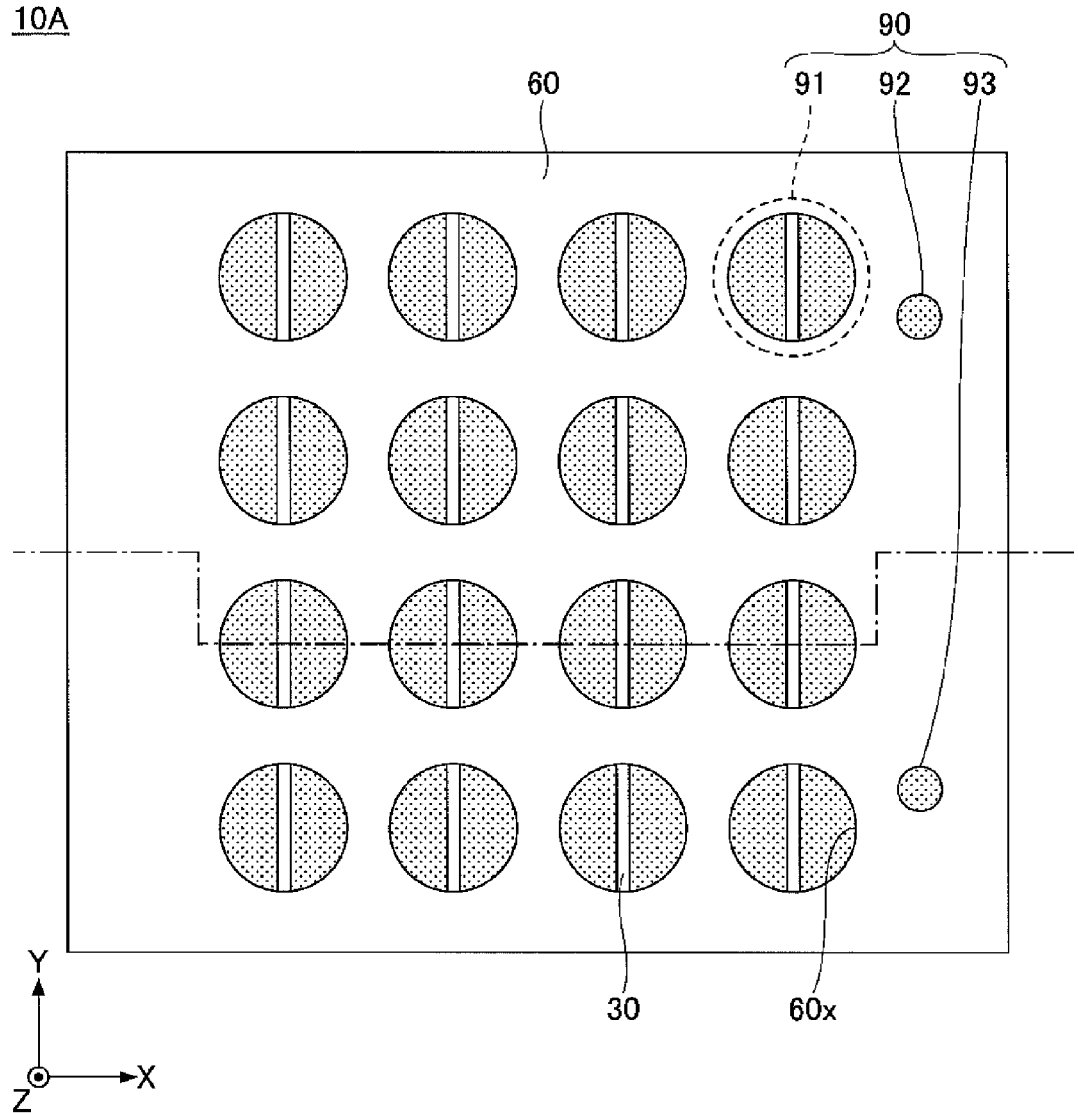
FIG. 38 is a plan view of a light-emitting element mounting package of a fourth embodiment.
Figure 39:
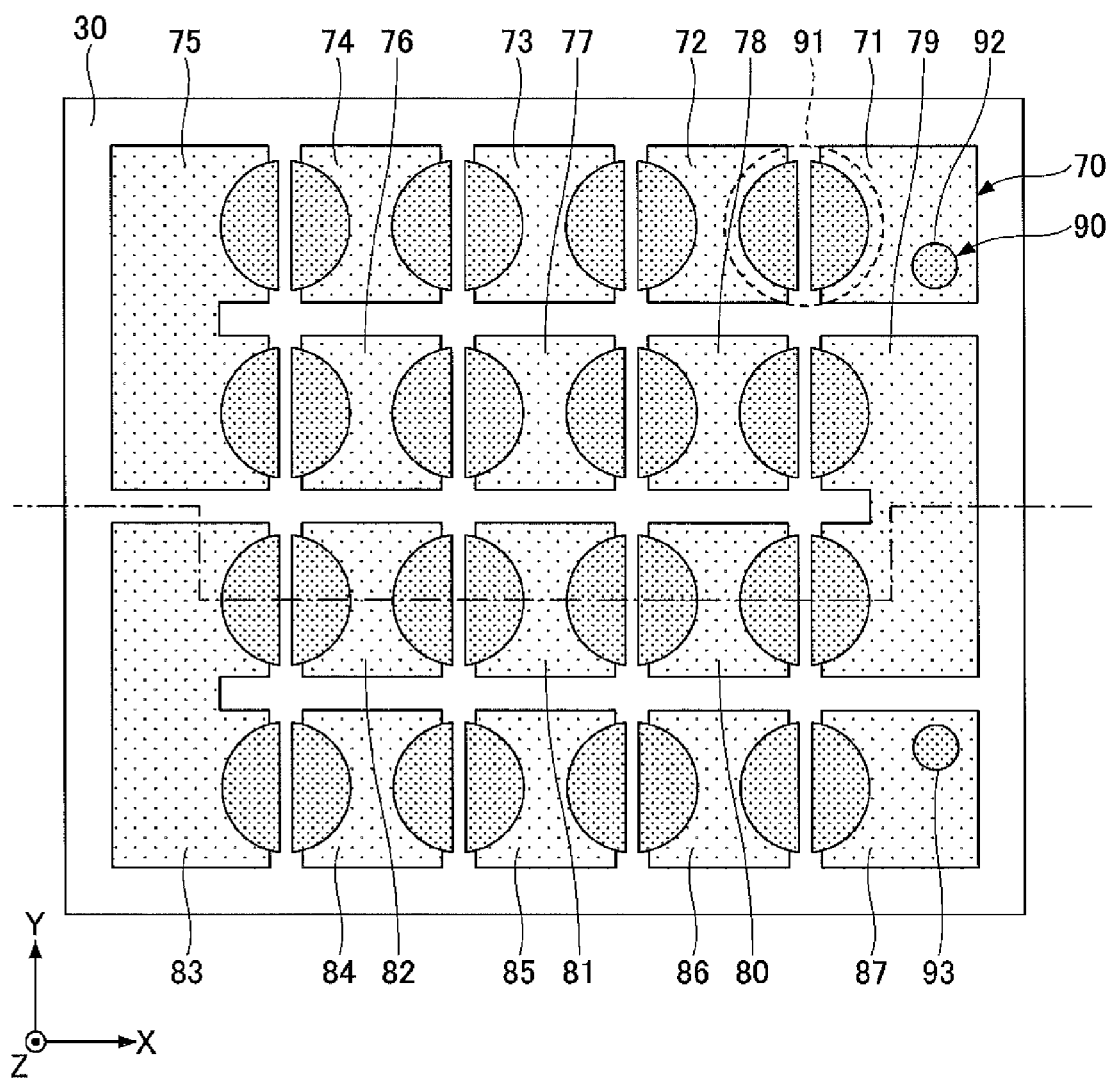
FIG. 39 is another plan view of the light-emitting element mounting package of the fourth embodiment.

FIG. 38 is a plan view of a light-emitting element mounting package 10A of the fourth embodiment. FIG. 39 is another plan view of the light-emitting element mounting package 10A of the fourth embodiment. In FIG. 39, a reflective film 60 illustrated in FIG. 38 is omitted.

Referring to FIGS. 38 and 39, light-emitting element mounting portions 70 includes wiring portions 71 to 87 which are electrically insulated one another. The light-emitting element mounting portions 70 are formed on an insulating layer 30 in a manner similar to the light-emitting element mounting portion 40 in the first embodiment.

The wiring portions 71 to 87 are shaped like a ruler or a rectangle in their plan views. The wiring portions 71 to 87 are arranged so that a predetermined gap is interposed between facing sides of adjacent wiring portions arranged in parallel along the Y direction. However, the lengths of the wiring portions 75, 79 and 83 in the Y direction are longer than the lengths of the other wiring portions. For example, the lengths of the wiring portions 75, 79 and 83 are about twice as long as the lengths of the other wiring portions.

The wiring portions 71 to 74 and a part of the wiring portion 75 are arranged in this order along the minus X direction while interposing predetermined gaps between the wiring portions 71 to 75. The other part of the wiring portion 75, the wiring portions 76 to 78, and a part of the wiring portion 79 are arranged in this order along the plus X direction while interposing predetermined gaps between the wiring portions 75 to 79. The other part of the wiring portion 79, the wiring portions 80 to 82, and a part of the wiring portion 83 are arranged in this order along the minus X direction while interposing predetermined gaps between the wiring portions 79 to 83. The other part of the wiring portion 83 and the wiring portions 84 to 87 are arranged in this order along the plus X direction while interposing predetermined gaps between the wiring portions 83 to 87. Said differently, the wiring portions 71 to 87 are arranged in a shape of a rectangular wave bending at the wiring portions 75, 79 and 83 in their plan views.

In the wiring portions 71 to 87 other than the wiring portions 75, 79, and 83, the length of the sides parallel to the X direction may be, for example, about 1 mm to about 5 mm, and the length of the sides parallel to the Y direction may be, for example, about 1 mm to about 5 mm. In the wiring portions 75, 79, and 83, the length of the sides parallel to the X direction may be, for example, about 1 mm to about 5 mm. The length of the sides parallel to the Y direction may be, for example, about 2 mm to about 10 mm. In the wiring portions 71 to 87, gaps between the adjacent wiring portions along the X direction may be, for example, about 50 μm to about 100 μm.

Electroplating films 90 are formed on predetermined areas of the wiring portions 71 to 87. The object of forming the electroplating films 90 is to improve connection reliability between parts to be connected to the electroplating films 90 and the electroplating films 90. The material and thickness of the electroplating films 90 are similar to those of the electroplating films 50.

A light-emitting element mounting area 91 is formed by mutually facing electroplating films 90 which are respectively formed on adjacent wiring portions. The light-emitting element mounting area 91 is formed by electroplating films 90, which are shaped like semicircles in their plan views and arranged while interposing the gap between the wiring portions respectively having the electroplating films 90. One light-emitting element having two terminals may be installed in the light-emitting element mounting area 91. However, one light-emitting element having four terminals may be installed in the light-emitting element mounting area 91.

On the wiring portion 71, a first electrode 92 is formed by the electroplating film 90. The first electrode 92 is electrically connected to a part of the light-emitting element mounting areas 91 formed on the wiring portion 71. On the wiring portion 87, a second electrode 93 is formed by the electroplating film 90. The second electrode 93 is electrically connected to a part of the light-emitting element mounting area 91 formed on the wiring portion 87. The first electrode 92 and the second electrode 93 are connected to, for example, a power source, a driving circuit, or the like which is arranged outside the light-emitting element mounting package 10A.

As described, the wiring portions 71 to 87 of the light-emitting element mounting portions 70 are arranged in a rectangular wave shape bending at the wiring portions 75, 79, and 83. The light-emitting element mounting areas 91 are formed between corresponding adjacent wiring portions. The first electrode 92 and the second electrode 93 are formed on wiring portions 71 and 87 on the both ends of the wiring portions arranged in the rectangular wave shape, respectively. Therefore, the light-emitting elements are mounted in series on the light-emitting element mounting areas 91 between the first electrode 92 and the second electrode 93.

The light-emitting element mounting packages 10A are manufactured in processes similar to those in the first through third embodiments.

As described, in the light-emitting element mounting packages 10A, the light-emitting element mounting portions 70 may be mounted in series or parallel as in the first embodiment.

[e] Fifth Embodiment

Within the fifth embodiment, a light-emitting element package different from the first embodiment is exemplified. Within the fifth embodiment, explanation of constructional elements the same as those described in the above description is omitted.

Figure 40:
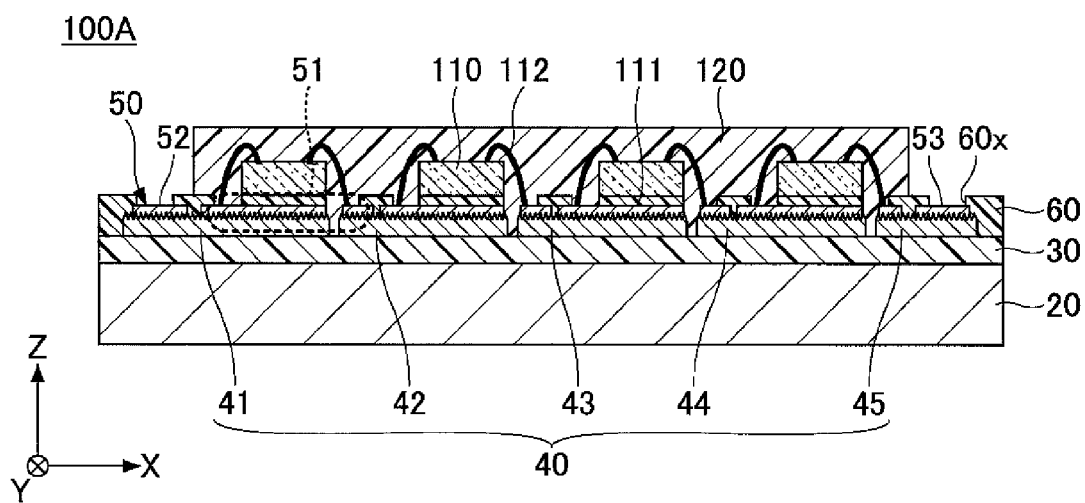
FIG. 40 is a cross-sectional view of a light-emitting element package of a fifth embodiment.
Figure 41:
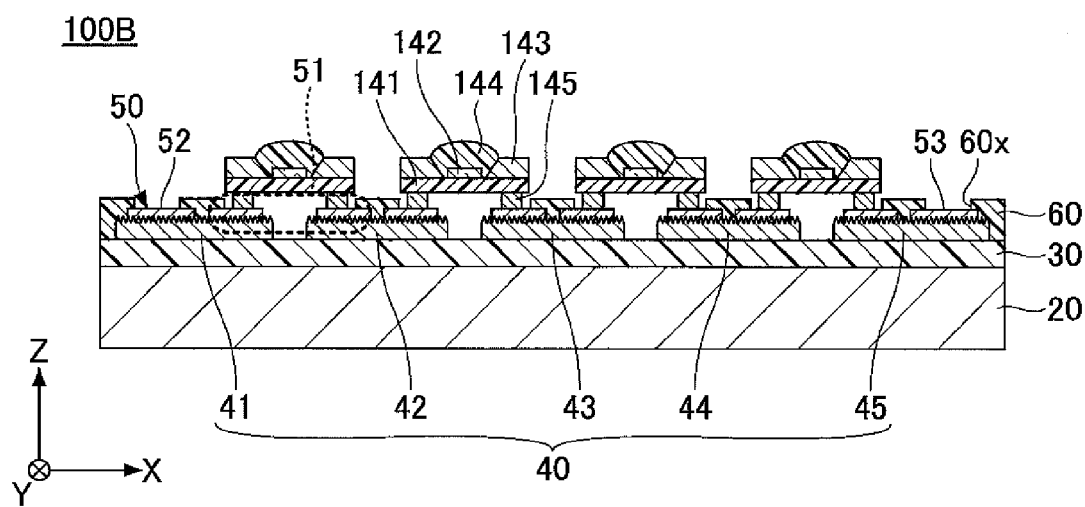
FIG. 41 is another cross-sectional view of the light-emitting element package of the fifth embodiment.
Figure 42:
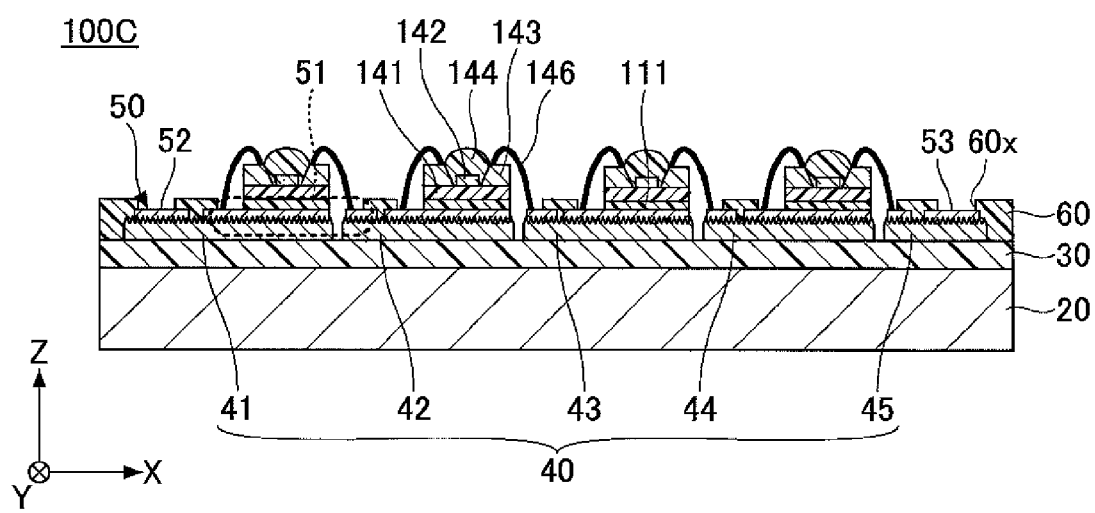
FIG. 42 is another cross-sectional view of the light-emitting element package of the fifth embodiment.

FIG. 40 is a cross-sectional view of a light-emitting element package 100A of the fifth embodiment. FIG. 41 is a cross-sectional view of the light-emitting element package 100B of the fifth embodiment. FIG. 42 is a cross-sectional view of a light-emitting element 100C package of the fifth embodiment.

In the light-emitting element package 100 illustrated in FIG. 4, the light-emitting element 110 is connected to the mutually adjacent wiring portions by flip-chip bonding. Referring to FIG. 40, in the light-emitting element package 100A, the light-emitting elements 110 are fixed to the corresponding wiring portions via a bonding layer 111. The light-emitting elements 110 are connected to adjacent wiring portions via metallic thin wires 112 by wire bonding.

Referring to FIG. 41, in the light-emitting element package 100B, light-emitting chips 142 mounted on submount substrates 141 made of a ceramic or the like are connected to the adjacent wiring portions via bumps 145 by solder bonding. Reflection plates 143 are provided around the light-emitting chips 142 mounted on the submount substrates 141. The light-emitting chips 142 are sealed by a sealing resin 144.

Referring to FIG. 42, in the light-emitting element package 100C, light-emitting chips 142 mounted on submount substrates 141 are connected to the adjacent wiring portions via metallic thin wires 146 by wire bonding. In a manner similar to FIG. 41, reflection plates 143 are provided around the light-emitting chips 142 mounted on the submount substrates 141. The light-emitting chips 142 are sealed by a sealing resin 144.

As described, the light-emitting elements such as a LED may be connected to the light-emitting element mounting package by wire bonding to obtain the light-emitting element package 100A. As described, the light-emitting element submounts such as a LED submount may be connected to the light-emitting element mounting package by flip-chip bonding or wire bonding to obtain the light-emitting element package 100B or 100C.

For example, the light-emitting elements may be mounted on the light-emitting element mounting package of the second, third or fourth embodiment to realize a light-emitting element package.

Further, the process corresponding to FIGS. 18 to 20 may be applied to the processes of the second or third embodiment.

The light-emitting element mounting package may be a simple structure on which only one light-emitting element can be installed.

The light-emitting element to be mounted may be pre-mold or may be previously installed in a ceramic submount substrate.

The embodiments of the present invention can provide a light-emitting element mounting package which can reduce property degradation of a reflective film, a light-emitting element package in which plural light-emitting elements are mounted on the light-emitting element mounting package, and a manufacturing method of these.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a light-emitting element mounting package, the method comprising:
   laminating a metallic layer on an insulating layer;
   forming on the metallic layer a first electroplating film and a second electroplating film separated along a surface of the metallic layer, and a third electroplating film and a fourth electroplating film separated along the surface of the metallic layer, said electroplating wherein the second electroplating film and the third electroplating film define a light-emitting element mounting area;
   forming a first wiring portion and a second wring portion separated by a predetermined first gap, by removing predetermined portions of the metallic layer,
   wherein, in the forming the first wiring portion and the second wiring portion, the metallic layer is removed so that the first electroplating film and the second electroplating film belong to the first wiring portion and the third electroplating film and the fourth electroplating film belong to the second wiring portion, and
   forming a reflective film to cover an upper surface of the insulating layer, cover a predetermined second gap where the first electroplating film and the second electroplating film are separated along a surface of the first wiring portion, and cover a predetermined third gap where the third electroplating film and the fourth electroplating film are separated along a surface of the second wiring portion, the reflective film being further formed to include an opening portion through which the light-emitting element mounting area is exposed, the predetermined second gap and the predetermined third gap being substantially a same in size.

2. The method of manufacturing the light-emitting element mounting package according to claim 1,
   wherein an uppermost layer of each of the electroplating films is an Ag film or an Ag alloy film, each of the electroplating films is an Ag film or an Ag alloy film, or each of the electroplating films is a laminated layer formed by arranging Au or a Au alloy on Ni or a Ni alloy, Au or a Au alloy on Pd or a Pd alloy further on Ni or a Ni alloy, Au or a Au alloy on Ag or a Ag alloy further on Pd or a Pd alloy furthermore on Ni or a Ni alloy, Ag or a Ag alloy on Ni or a Ni alloy, or Ag or a Ag alloy on Pd or a Pd alloy further on Ni or a Ni alloy.

3. The method of manufacturing the light-emitting element mounting package according to claim 1,
   wherein the plurality of wiring portions are shaped in a ruler or a rectangle, and are formed so that long sides of mutually adjacent wiring portions of the plurality of wiring portions face each other.

4. The method of manufacturing the light-emitting element mounting package according to claim 1, further comprising:
   roughening a surface of the metallic layer.

5. The method of manufacturing the light-emitting element mounting package according to claim 1, further comprising:
   roughening surfaces of the plurality of wiring portions.

6. The method of manufacturing the light-emitting element mounting package according to claim 4,
   wherein peripheries of the first through fourth electroplating films are covered with the reflective film.

7. A method of manufacturing a light-emitting element package comprising:
   mounting a light-emitting element on the light-emitting element mounting area manufactured by the method of manufacturing the light-emitting element mounting package according to claim 1.

8. A method of manufacturing a light-emitting element mounting package, the method comprising:
   laminating a metallic layer on an insulating layer;
   forming a first wiring portion and a second wiring portion separated by a predetermined first gap, by removing predetermined portions of the metallic layer;
   forming a bus line for electrically connecting the plurality of the wiring portions;
   forming on the first wiring portion a first electroplating film and a second electroplating film separated by a predetermined second gap, and forming on the second wiring portion a third electroplating film and a fourth electroplating film separated by the predetermined second gap, said electroplating films being formed by electroplating using the bus line, and wherein the second electroplating film and the third electroplating film define a light-emitting element mounting area;
   removing the bus line after forming the light-emitting element mounting area; and
   forming a reflective film to cover an upper surface of the insulating layer, cover the predetermined second gap between the first electroplating film and the second electroplating film of the first wiring portion, and cover the predetermined second gap between the third electroplating film and the fourth electroplating film of the second wiring portion, the reflective film being further formed to include an opening portion through which the light-emitting element mounting area is exposed.

9. The method of manufacturing the light-emitting element mounting package according to claim 8,
   wherein, in the forming the bus line, the bus line is formed so as to include a frame portion, which is positioned outside the plurality of wiring portions and surrounds the plurality of wiring portions, and to include connecting portions, which connect the plurality of wiring portions to the frame.

10. A light-emitting element mounting package comprising:
    an insulating layer;
    a first wiring portion and a second wiring portion formed on the insulating layer and separated by a predetermined first gap;
    a first electroplating film and a second electroplating film formed on the first wiring portion and separated by a predetermined second gap, the first electroplating film being formed on a first side of the first wiring portion, the second electroplating film being formed on a second side of the first wiring portion being opposite to the first side;
    a third electroplating film and a fourth electroplating film formed on the second wiring portion and separated by the predetermined second gap, the third electroplating film being formed on a first side of the second wiring portion, the fourth electroplating film being formed on a second side of the second wiring portion being opposite to the first side;
    a light-emitting element mounting area formed by the second electroplating film on the first wiring portion and the third electroplating film on the second wiring portion; and
    a reflective film which includes an opening portion through which the light-emitting element mounting area is exposed, covers an upper surface of the insulating layer, covers the predetermined second gap between the first electroplating film and the second electroplating film on the first wiring portion, and covers the predetermined second gap between the third electroplating film and the fourth electroplating film on the second wiring portion.

11. The light-emitting element mounting package according to claim 10,
wherein an uppermost layer of each of the electroplating films is an Ag film or an Ag alloy film, each of the electroplating films is an Ag film or an Ag alloy film, or each of the electroplating films is a laminated layer formed by arranging Au or a Au alloy on Ni or a Ni alloy, Au or a Au alloy on Pd or a Pd alloy further on Ni or a Ni alloy, Au or a Au alloy on Ag or a Ag alloy further on Pd or a Pd alloy furthermore on Ni or a Ni alloy, Ag or a Ag alloy on Ni or a Ni alloy, or Ag or a Ag alloy on Pd or a Pd alloy further on Ni or a Ni alloy.

12. The light-emitting element mounting package according to claim 10,
wherein the plurality of wiring portions are shaped in a ruler or a rectangle, and
long sides of mutually adjacent wiring portions of the plurality of wiring portions face each other interposing a predetermined gap.

13. The light-emitting element mounting package according to claim 10,
wherein peripheries of the first through fourth electroplating films are covered with the reflective film.

14. A light-emitting element package comprising:
the light-emitting element mounting package according to claim 10; and
a light emitting element mounted on the light-emitting element mounting area of the light-emitting element mounting package.

* * * * *